United States Patent
Daikoku et al.

(10) Patent No.: US 9,822,468 B2
(45) Date of Patent: Nov. 21, 2017

(54) METHOD FOR PRODUCING SIC SINGLE CRYSTAL

(71) Applicants: TOYOTA JIDOSHA KABUSHIKI KAISHA, Toyota-shi, Aichi-ken (JP); NIPPON STEEL & SUMITOMO METAL CORPORATION, Tokyo (JP)

(72) Inventors: Hironori Daikoku, Susono (JP); Kazuhito Kamei, Tokyo (JP); Kazuhiko Kusunoki, Tokyo (JP); Kazuaki Seki, Tokyo (JP); Yutaka Kishida, Tokyo (JP)

(73) Assignees: TOYOTA JIDOSHA KABUSHIKI KAISHA, Toyota (JP); NIPPON STEEL & SUMITOMO METAL CORPORATION, Tokyo (JP)

( * ) Notice: Subject to any disclaimer, the term of this patent is extended or adjusted under 35 U.S.C. 154(b) by 25 days.

(21) Appl. No.: 15/145,050

(22) Filed: May 3, 2016

(65) Prior Publication Data
US 2016/0340794 A1 Nov. 24, 2016

(30) Foreign Application Priority Data
May 18, 2015 (JP) .................................. 2015-101400

(51) Int. Cl.
*C30B 9/06* (2006.01)
*C30B 29/36* (2006.01)

(52) U.S. Cl.
CPC ............... *C30B 29/36* (2013.01); *C30B 9/06* (2013.01)

(58) Field of Classification Search
CPC combination set(s) only.
See application file for complete search history.

(56) References Cited

U.S. PATENT DOCUMENTS

| | | | |
|---|---|---|---|
| 2012/0137965 A1* | 6/2012 | Sudo | C03B 19/095 117/208 |
| 2013/0284083 A1 | 10/2013 | Okada et al. | |
| 2015/0167196 A1* | 6/2015 | Kado | C30B 29/36 428/64.1 |

FOREIGN PATENT DOCUMENTS

| | | |
|---|---|---|
| JP | 2012-180244 A | 9/2012 |
| JP | 2013-177267 A | 9/2013 |
| KR | 2013-0109191 A | 10/2013 |
| KR | 2014-0030730 A | 3/2014 |

\* cited by examiner

*Primary Examiner* — Duy Deo
*Assistant Examiner* — Erin Bergner
(74) *Attorney, Agent, or Firm* — Oliff PLC

(57) ABSTRACT

A method for producing a SiC single crystal by a solution process is provided, which allows generation of miscellaneous crystals to be reduced. Method for producing a SiC single crystal wherein a crucible has thickness Lu in horizontal direction at same height as liquid level of Si—C solution, and thickness Ld in horizontal direction at same height as bottom inner wall, Ld/Lu is 2.00 to 4.21, and thickness in horizontal direction of crucible monotonously increases between Lu and Ld from Lu toward Ld, wall thickness of crucible is 1 mm or greater, bottom thickness Lb in vertical direction of crucible is between 1 mm and 15 mm, bottom outer wall of crucible has flat section with area of 100 mm² or greater, depth of Si—C solution from bottom inner wall is 30 mm or greater, and method includes heating and electromagnetic stirring Si—C solution with high-frequency coil.

2 Claims, 18 Drawing Sheets

MISCELLANEOUS CRYSTAL ADHESION

MISCELLANEOUS CRYSTAL ADHESION

METHOD FOR PRODUCING SIC SINGLE CRYSTAL

TECHNICAL FIELD

The present disclosure relates to a method for producing a SiC single crystal that is suitable as a semiconductor element.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials, and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or a metal other than Si melted in molten Si is formed in a graphite crucible and C is dissolved from the graphite crucible into the molten liquid, and a SiC crystal layer is deposited and grown on a seed crystal substrate set in the low temperature section. Solution processes are most promising for reducing defects since crystal growth is carried out in a state of near thermal equilibrium, compared to gas phase processes. Recently, therefore, methods for producing SiC single crystals by solution processes have been proposed.

PTL 1 proposes a method for producing a SiC single crystal by a solution process in which a heat-insulating material having a prescribed shape is situated in the bottom section region of a crucible to inhibit generation of miscellaneous crystals in the Si—C solution.

CITATION LIST

Patent Literature

[PTL 1] Japanese Unexamined Patent Publication No. 2012-180244

SUMMARY OF THE INVENTION

Problems to be Solved by the Invention

However, in the method described in PTL 1, while it is possible to inhibit generation of miscellaneous crystals in the Si—C solution to some extent, the suppression of miscellaneous crystals has still often been inadequate.

The method of the present disclosure solves the problem mentioned above, and its object is to provide a method for producing a SiC single crystal by a solution process, which allows generation of miscellaneous crystals to be reduced compared to the prior art.

Means for Solving the Problems

The present disclosure relates to a method for producing a SiC single crystal in which a seed crystal substrate is contacted with a Si—C solution that is placed in a crucible and has a temperature gradient such that the temperature decreases from the interior toward the liquid level, for growth of a SiC single crystal, wherein:

the crucible has a thickness Lu in the horizontal direction of the crucible at the same height as the liquid level of the Si—C solution, and a thickness Ld in the horizontal direction of the crucible at the same height as the bottom inner wall of the crucible, the ratio Ld/Lu of Ld to Lu being 2.00 to 4.21, and the thickness in the horizontal direction of the crucible increasing in a monotonous manner between the thickness Lu and the thickness Ld, from the thickness Lu toward the thickness Ld, the wall thickness of the crucible is 1 mm or greater, the thickness Lb in the vertical direction of the bottom section of the crucible is between 1 mm and 15 mm, the bottom outer wall of the crucible has a flat section, the area of the flat section being 100 $mm^2$ or greater, the depth of the Si—C solution placed in the crucible from the bottom inner wall of the crucible is 30 mm or greater, and the method comprises heating and electromagnetic stirring of the Si—C solution with a high-frequency coil situated on the periphery of the crucible.

Effect of the Invention

According to the method of the present disclosure it is possible to produce a SiC single crystal with reduced generation of miscellaneous crystals compared to the prior art, using a solution process.

DESCRIPTION OF EMBODIMENTS

Figure 1:
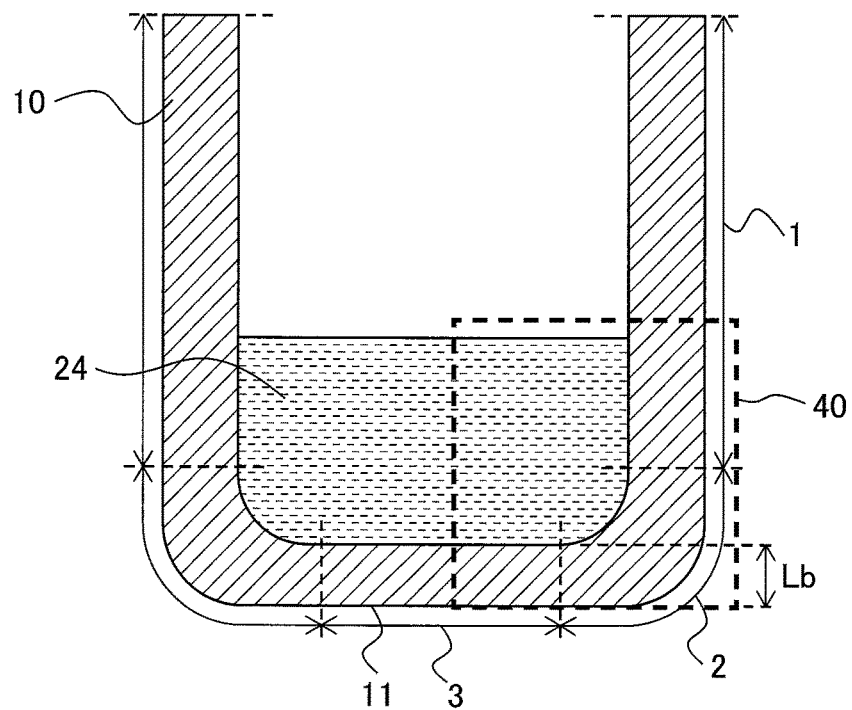
FIG. 1 is a cross-sectional schematic drawing showing an example of a crucible that may be used in the method of the present disclosure.

Throughout the present specification, the indication "-1" in an expression, such as "(000-1) face", is used where normally a transverse line is placed over the numeral.

When miscellaneous crystals are generated in a Si—C solution, the miscellaneous crystals adhere to the grown crystal, making it impossible to obtain a homogeneous single crystal. Upon diligent research on the mechanism of miscellaneous crystal formation, it was found that miscellaneous crystals are formed when the temperature gradient of the Si—C solution is increased near the inner wall of the crucible. The Si—C solution exhibits a maximum temperature at the location of contact with the inner wall of the crucible, and exhibits a relatively low temperature at a point separated by a prescribed distance, from the location where the maximum temperature is exhibited toward the surface of the Si—C solution directly below the center section of the crystal growth plane, and therefore a temperature difference $\Delta T$ is formed in the Si—C solution, in which the temperature decreases, with the location of contact with the inner wall of the crucible as the maximum temperature. Since more carbon dissolves in a Si—C solution at high temperature, a large temperature difference $\Delta T$ increases the degree of supersaturation, and carbon dissolved near the inner wall of the crucible is deposited in the Si—C solution, forming miscellaneous crystals and adhering to the grown crystal.

Having obtained the aforementioned knowledge, the present inventors discovered a method for producing a SiC single crystal by a solution process, that allows generation of miscellaneous crystals to be reduced compared to the prior art.

The method of the present disclosure is a method for producing a SiC single crystal in which a seed crystal substrate is contacted with a Si—C solution that is placed in a crucible and has a temperature gradient such that the temperature decreases from the interior toward the liquid level, for growth of a SiC single crystal, wherein the crucible has a thickness Lu in the horizontal direction of the crucible at the same height as the liquid level of the Si—C solution, and a thickness Ld in the horizontal direction of the crucible at the same height as the bottom inner wall of the crucible, the ratio Ld/Lu of Ld to Lu being 2.00 to 4.21, and the thickness in the horizontal direction of the crucible increasing in a monotonous manner between the thickness Lu and the thickness Ld, from the thickness Lu toward the thickness Ld, the wall thickness of the crucible is 1 mm or greater, the thickness Lb in the vertical direction of the bottom section of the crucible is between 1 mm and 15 mm, the bottom outer wall of the crucible has a flat section, the area of the flat section being 100 $mm^2$ or greater, the depth of the Si—C solution placed in the crucible from the bottom inner wall of the crucible is 30 mm or greater, and the method comprises heating and electromagnetic stirring of the Si—C solution with a high-frequency coil situated on the periphery of the crucible.

According to the method of the present disclosure, it is possible to reduce the temperature gradient of the Si—C solution near the inner wall of the crucible where the maximum temperature is exhibited in the Si—C solution, thereby allowing formation of miscellaneous crystals to be reduced compared to the prior art.

Throughout the present specification, $\Delta T$ will be used to represent the difference between the maximum temperature of the Si—C solution at the location of contact with the inner wall of the crucible, and the temperature at the point 6 mm from the location that exhibits the maximum temperature toward the surface of the Si—C solution directly below the center section of the crystal growth plane (hereunder referred to either as "temperature difference $\Delta T$" or simply "$\Delta T$"). By reducing the temperature difference $\Delta T$ within this range it is possible to reduce formation of miscellaneous crystals. The temperature difference $\Delta T$ obtained by the method of the present disclosure is essentially 0° C.

The difference between the maximum temperature of the Si—C solution at the location of contact with the inner wall of the crucible, and the temperature at the surface of the Si—C solution directly below the center section of the crystal growth plane is maximum, and the temperature difference is indicated as $\Delta T_{max}$. The $\Delta T_{max}$ temperature is not particularly restricted from the viewpoint of reducing miscellaneous crystals, but is preferably 5° C. or higher from the viewpoint of obtaining a high growth rate.

FIG. 1 is a cross-sectional schematic drawing showing an example of a crucible that may be used in the method of the present disclosure. The crucible 10 holds a Si—C solution 24.

Throughout the present specification, the side section, bottom side section and bottom section of the crucible 10 are references to the side section 1, bottom side section 2 and bottom section 3 of the crucible shown in FIG. 1. The side section 1 is the region in which the inner wall of the crucible 10 extends in a straight linear manner in the vertical direction, the bottom section 3 is the region in which the inner wall of the crucible extends in a straight linear manner in the horizontal direction, and the bottom side section 2 is the region between the side section 1 and the bottom section 3. In the crucible 10 of FIG. 1, the inner wall and outer wall of the bottom side section 2 have curved shapes.

Figure 2:
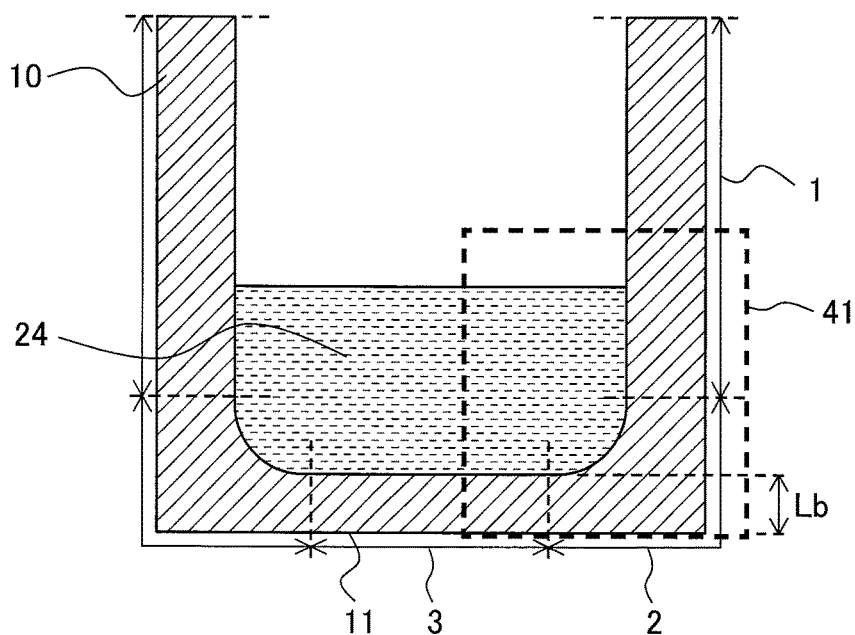
FIG. 2 is a cross-sectional schematic drawing showing another example of a crucible that may be used in the method of the present disclosure.

FIG. 2 is a cross-sectional schematic drawing showing another example of a crucible 10. In the crucible 10 of FIG. 2, the outer wall of the bottom side section 2 between the side section 1 and the bottom section 3 has a straight linear (right angular) shape.

Figure 3:
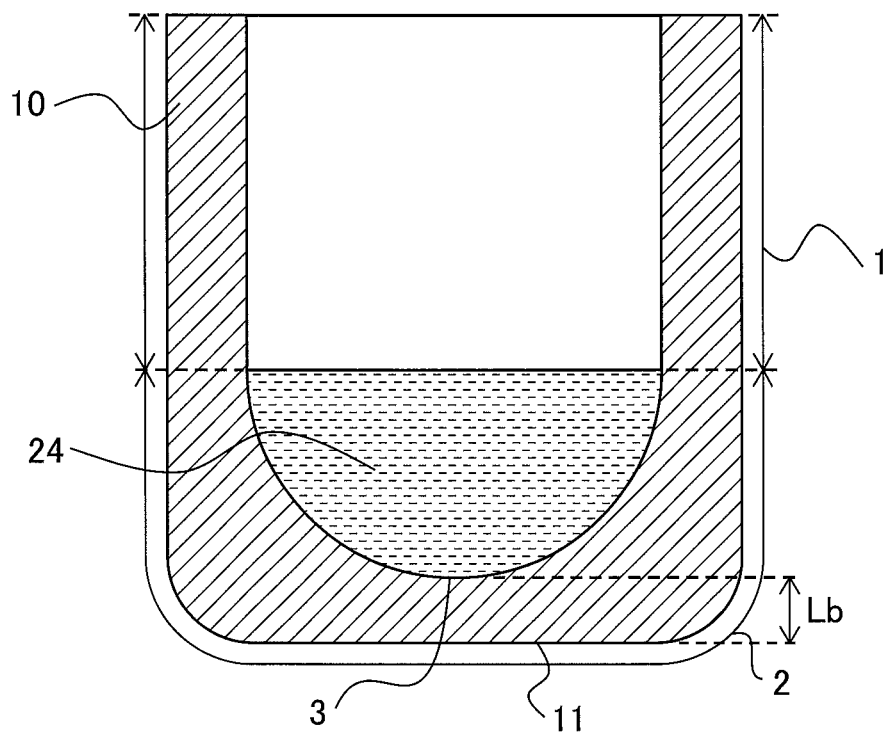
FIG. 3 is a cross-sectional schematic drawing showing another example of a crucible that may be used in the method of the present disclosure.

FIG. 3 is a cross-sectional schematic drawing showing another example of a crucible. In the crucible 10 of FIG. 3, the inner walls of the bottom side section and the bottom section are all formed with curved shapes. In this case as well, the crucible 10 is composed of the side section 1, bottom side section 2 and bottom section 3. In the crucible 10 of FIG. 3, the bottom section 3 is the location where the inner wall is situated at the lowest point.

Figure 4:
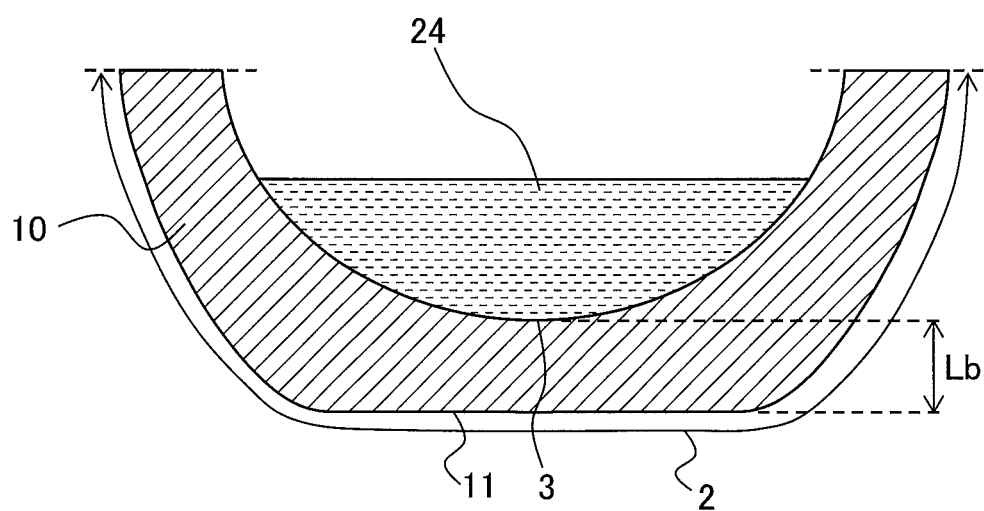
FIG. 4 is a cross-sectional schematic drawing showing another example of a crucible that may be used in the method of the present disclosure.

FIG. 4 is a cross-sectional schematic drawing showing another example of a crucible. In the crucible 10 of FIG. 4, the inner walls are all formed with curved shapes. The crucible 10 of FIG. 4 has no side section, and is composed of the bottom side section 2 and bottom section 3. In the crucible 10 of FIG. 4, the bottom section 3 is the location where the inner wall is situated at the lowest point.

As shown in FIGS. 1 to 4, the inner wall and outer wall of the bottom side section 2 may have any desired shapes, such as curved shapes or straight linear shapes. The inner wall of the bottom side section 2 preferably has a prescribed curvature radius. The lower limit for the curvature radius of the inner wall of the bottom side section 2 is preferably R20 mm or greater, R25 mm or greater, R30 mm or greater or R35 mm or greater, and the upper limit is preferably no greater than R50 mm, no greater than R45 mm, no greater than R40 mm or no greater than R35 mm.

The thickness of the side section of the crucible 10 in the horizontal direction is preferably 5 to 20 mm, and the thickness at the location of the inner wall of the bottom side section, in the horizontal direction, is preferably 10 to 84 mm. With these ranges for the thicknesses of the side section and the bottom side section of the crucible 10 in the horizontal direction, it is possible to minimize formation of miscellaneous crystals while allowing the Si—C solution to flow more satisfactorily due to the electromagnetic stirring effect of the high-frequency coil.

Figure 5:
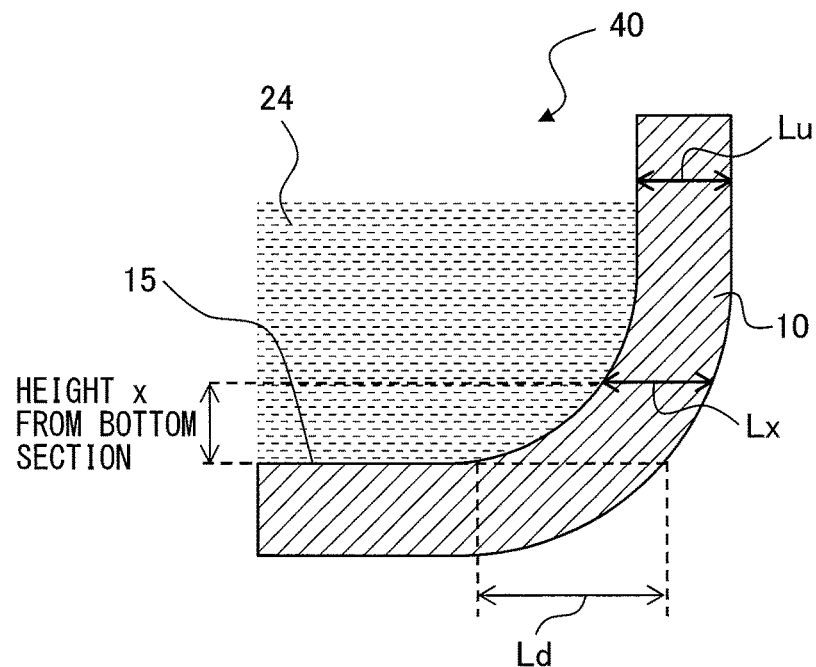
FIG. 5 is a magnified cross-sectional view of a region 40 of the bottom side section shown in FIG. 1.

FIG. 5 is a magnified cross-sectional view of the region 40 of the bottom side section shown in FIG. 1. As shown in FIG. 5, the thickness of the crucible 10 in the horizontal direction at the same height as the liquid level of the Si—C solution 24 is denoted as "Lu". Also, the thickness of the crucible 10 in the horizontal direction at the same height as the bottom inner wall 15 of the crucible 10 is denoted as "Ld".

According to the method of the present disclosure, the ratio Ld/Lu, which is the ratio of the thickness Ld of the crucible 10 in the horizontal direction at the same height as the bottom inner wall 15 of the crucible 10 with respect to the thickness Lu of the crucible 10 in the horizontal direction at the same height as the liquid level of the Si—C solution 24, is 2.00 to 4.21. The upper limit for the ratio Ld/Lu is preferably no greater than 3.68, and the lower limit is preferably 3.12 or greater.

If the ratio Ld/Lu is within the above range, the temperature difference $\Delta T$ in the Si—C solution 24 can be set to 0° C.

Figure 6:
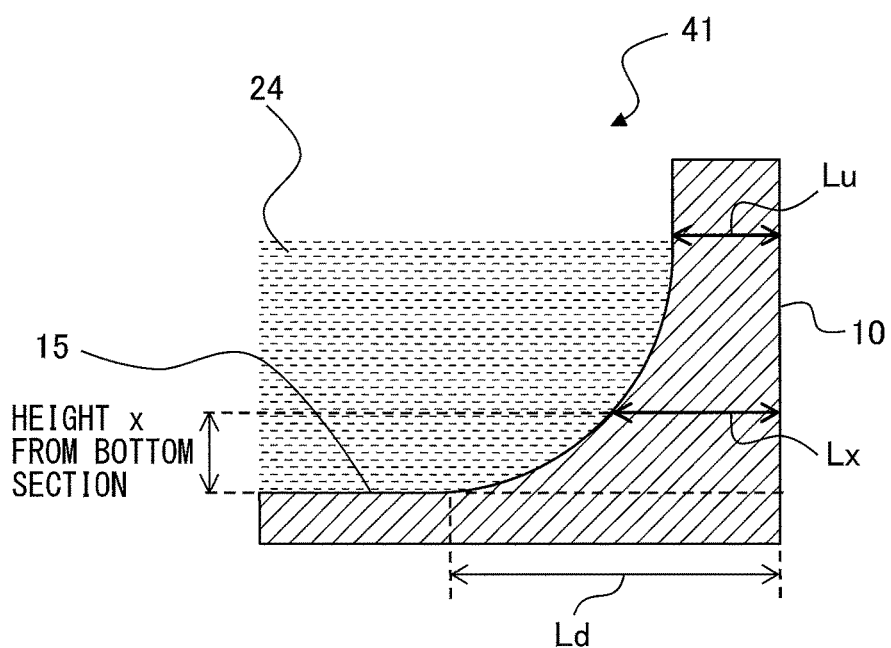
FIG. 6 is a magnified cross-sectional view of a region 41 of the bottom side section shown in FIG. 2.

FIG. 6 is a magnified cross-sectional view of the region 41 of the bottom side section shown in FIG. 2. With the crucible shown in FIG. 6 as well, as with the crucible 10 shown in FIG. 5 in which the outer wall of the bottom side section has a curved shape, the ratio Ld/Lu is within the range specified above.

As shown in FIG. 5 and FIG. 6, thickness of the crucible 10 in the horizontal direction between the thickness Lu and the thickness Ld is denoted as "Lx". The thickness Lx may vary depending on the height x from the bottom inner wall 15 of the crucible 10 in the vertical direction. Preferably, the thickness Lx increases in a monotonous manner from the thickness Lu toward the thickness Ld (from the upper toward the lower region of the crucible 10). In the bottom side section of the crucible 10, preferably the degree of increase increments gradually from the thickness Lu toward the thickness Ld (toward the lower region). Such "monotonous increase" also includes constancy, and the thickness of the crucible 10 is constant in the horizontal direction in the side section of the crucible 10.

The value of Lx is equal to Lu at the liquid level height of the Si—C solution, and is equal to Ld at the height of the bottom inner wall 15 of the crucible 10. Preferably, the thickness Lx decreases with a greater height x in the upward vertical direction from the bottom inner wall 15 of the crucible 10, and is equal to the thickness Lu of the crucible in the horizontal direction, at the same height as the liquid level of the Si—C solution 24.

The preferred range for the ratio of the thickness Lx with respect to the thickness Lu may be expressed as a function of the height x in the upward vertical direction from the bottom inner wall 15 of the crucible 10, and represented by inequality (1):

$$6.981 \times 10^{-8} x^6 - 8.192 \times 10^{-6} x^5 + 3.756 \times 10^{-4} x^4 - 8.572 \times 10^{-3} x^3 + 1.052 \times 10^{-1} x^2 - 7.503 \times 10^{-1} x + 4.21 \geq Lx/Lu \quad (1),$$

and inequality (2):

$$Lx/Lu \geq 1.190 \times 10^{-9} x^6 - 2.308 \times 10^{-7} x^5 + 1.832 \times 10^{-5} x^4 - 7.550 \times 10^{-4} x^3 + 1.706 \times 10^{-2} x^2 - 2.019 \times 10^{-1} x + 2.00 \quad (2)$$

(wherein x in inequality (1) and inequality (2) is 0 to 35).

Figure 7:
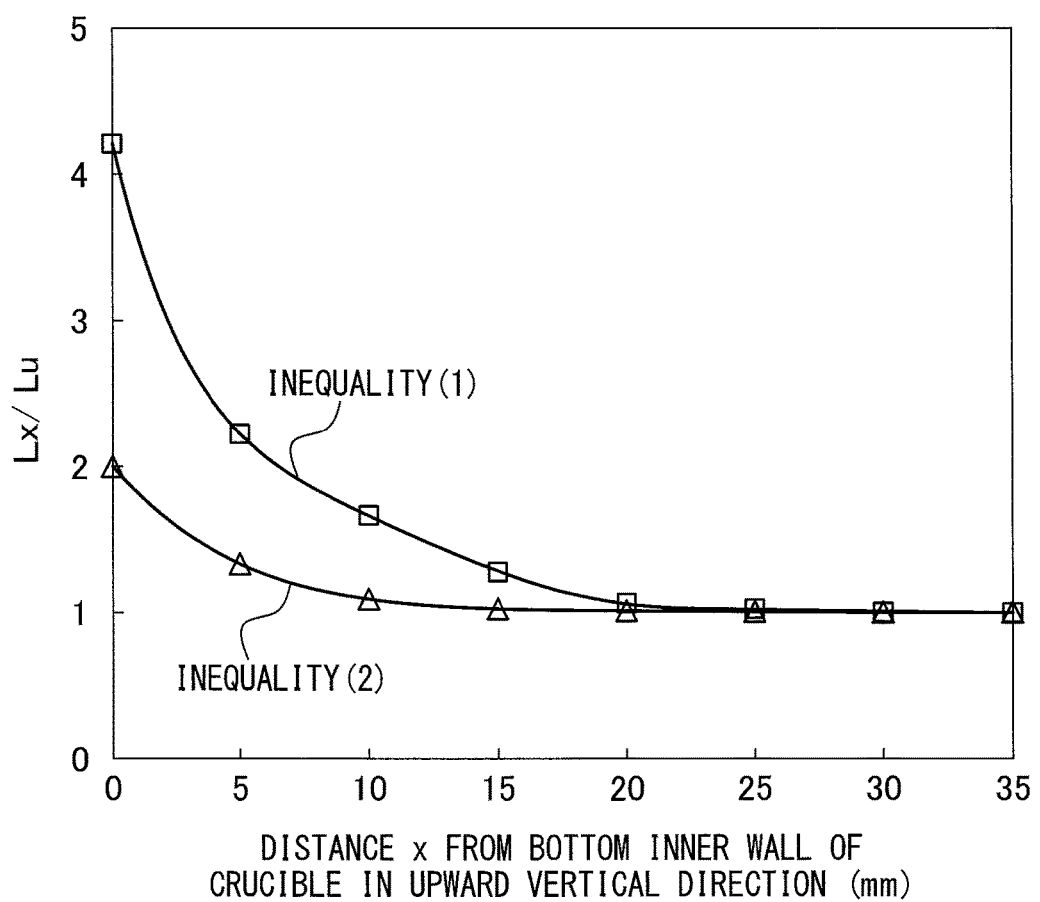
FIG. 7 is a graph showing the preferred range for Lx/Lu with respect to height x, based on inequality (1) and inequality (2).

FIG. 7 is a graph showing the preferred range for Lx/Lu with respect to height x, based on inequality (1) and inequality (2). The range between the graphs drawn by inequality (1) and inequality (2) is the preferred range for Lx/Lu.

The crucible 10 has a wall thickness of 1 mm or greater, preferably 2 mm or greater and more preferably 3 mm or greater, at all locations of the side section, bottom side section and bottom section. Throughout the present specification, the "wall thickness" is the thickness at the side section, bottom side section and bottom section of the crucible 10, in the direction perpendicular to the inner wall surface of the crucible 10. If the crucible 10 has a wall thickness within this range, it will be possible to prevent formation of holes by damage or dissolution of the crucible 10.

As shown in FIGS. 1 to 4, the crucible 10 has a bottom section thickness Lb. The bottom section thickness Lb is the thickness of the bottom section of the crucible 10 in the vertical direction. As shown in FIG. 3 and FIG. 4, when the bottom inner wall of the crucible 10 has a curved shape, the bottom section thickness Lb is the thickness of the bottom-most section of the inner wall of the bottom section of the crucible 10, in the vertical direction. The bottom section thickness Lb is the same as the wall thickness of the bottom section.

The bottom section thickness Lb of the crucible 10 is between 1 mm and 15 mm. The upper limit of the bottom section thickness Lb is preferably no greater than 12 mm and more preferably no greater than 10 mm, and the lower limit for the bottom section thickness Lb is preferably 2 mm or greater and more preferably 3 mm or greater. If the bottom section thickness Lb is within the above range, it will be possible to minimize the effects of heat from the lower region of the crucible 10 on the Si—C solution 24 and reduce the temperature difference $\Delta T$, while also preventing formation of holes by damage or dissolution of the crucible.

As shown in FIGS. 1 to 4, the crucible 10 has a bottom outer wall 11 that is a substantially flat section extending in the horizontal direction. The area of the flat section of the bottom outer wall 11 is 100 $mm^2$ or greater, preferably 200 $mm^2$ or greater and more preferably 300 $mm^2$ or greater.

If the area of the flat section of the bottom outer wall 11 is within the above range, the crucible 10 can be stably situated in the SiC single crystal production apparatus. When a SiC single crystal is to be grown, the location of the crucible 10 may be shifted up and down and/or the crucible 10 may be rotated, in which case as well, the crucible 10 can be stably situated if the area of the flat section of the bottom outer wall 11 is within the range specified above.

When the crucible 10 is situated in the SiC single crystal production apparatus, the crucible 10 is preferably placed on a heat-insulating material. Placement of the crucible 10 on the heat-insulating material may be by setting the crucible 10 on the heat-insulating material, or by anchoring the crucible 10 on the heat-insulating material using an adhesive, or by embedding at least a portion of the crucible 10 in the heat-insulating material. If the area of the flat section of the bottom outer wall 11 is within the above range, the crucible 10 can be stably situated by simply being set on the heat-insulating material. Even when the crucible 10 is anchored on the heat-insulating material using an adhesive, if the area of the flat section of the bottom outer wall 11 is within the above range, the adhesive can be situated between the flat section of the bottom outer wall 11 and the heat-insulating material, thereby allowing the crucible 10 to be more stably anchored. Even when at least a portion of the crucible 10 is embedded in the heat-insulating material, it can be stably situated if the bottom outer wall 11 is flat and the area is within the aforementioned range. A carbon adhesive may be used as the adhesive.

Figure 8:
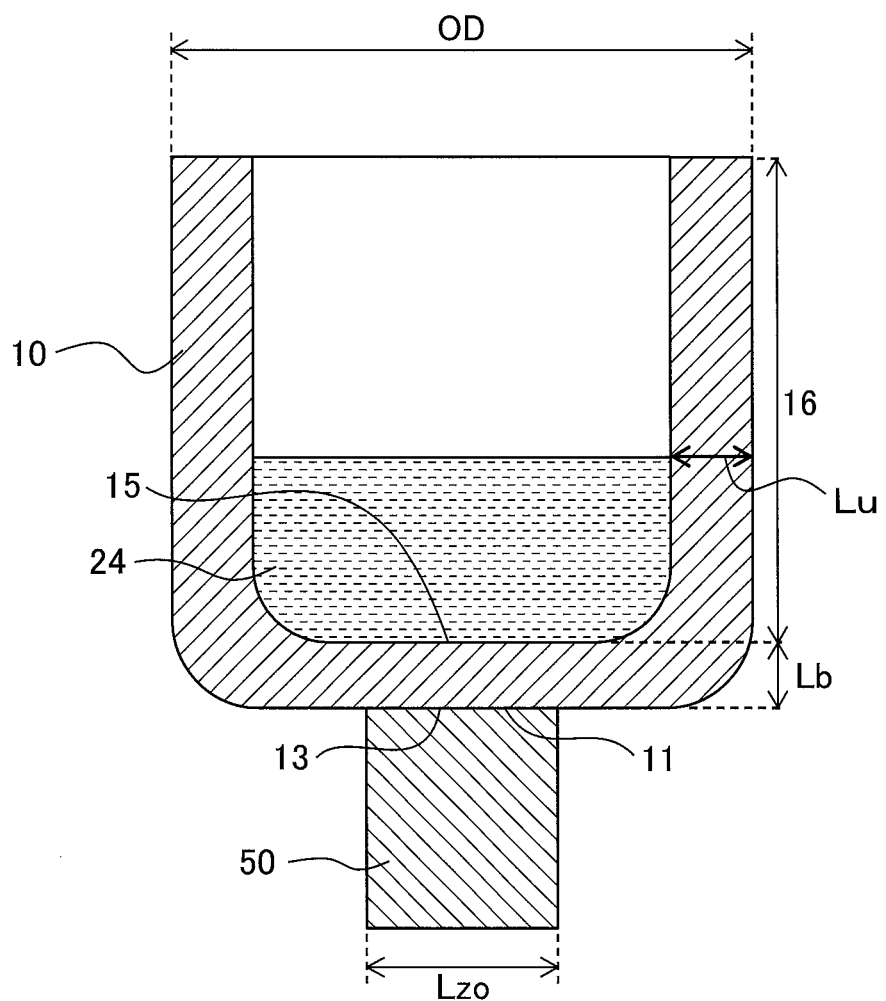
FIG. 8 is a cross-sectional schematic drawing showing an example of a crucible to be used in the method of the present disclosure, and a support member arranged on the bottom section of the crucible.

In the method of the present disclosure, as shown in FIG. 8, preferably a support member 50 is placed in contact with the bottom outer wall under the bottom outer wall of the crucible 10. The support member 50 is composed of the same material as the crucible 10. The crucible 10 and the support member 50 may be carbonaceous materials, such as graphite, or SiC, with greater strength than the material forming the heat-insulating material 18. The materials of the crucible 10 and support member 50 are preferably graphite with a density in the range of 1.55 to 2.00 $g/cm^3$. The heat-insulating material 18 used will generally be graphite having a density in the range of 0.1 to 0.16 $g/cm^3$.

When a support member 50 is provided, the support member 50 has a prescribed outer diameter Lzo, the outer diameter Lzo having a prescribed ratio with respect to the outer diameter OD of the crucible 10.

In the present specification, the outer diameter OD of the crucible 10 is the outer diameter of the crucible 10 at the same height as the location of the liquid level of the Si—C solution 24. As viewed from the top face, the crucible 10 may be circular (including round and elliptical), polygonal or the like, and the outer diameter OD is the longest diagonal length (the diameter of the smallest circle that internally includes the round, elliptical or polygonal shape), of the shape when the crucible 10 is viewed from the top face. The crucible 10 preferably has a round shape as viewed from the top face. In this case, the flow of the Si—C solution around the rotation axis as the center, when the crucible or seed crystal substrate is rotated, is isotropic, allowing stable growth of a homogeneous SiC single crystal.

The support member 50 may be any desired shape, so long as the shape has a substantially constant outer diameter Lzo in the vertical direction. The support member 50 may have, for example, a cylindrical (including regular cylindrical and elliptic cylindrical) or rectangular columnar shape. When the support member 50 has a regular cylindrical shape, the outer diameter Lzo of the support member 50 is its diameter, and when the support member 50 has an elliptic cylindrical or rectangular columnar shape, it is the length of the longest diagonal (the diameter of the smallest circle internally including the elliptic cylinder or polygon).

The support member 50 is situated under the bottom outer wall 11 of the crucible 10. The support member 50 has a top face 51 which is a substantially flat section extending in the horizontal direction. The crucible 10 and support member 50 may be placed so that the top face 51 of the support member 50 is in contact with the flat bottom outer wall 11, or the crucible 10 and support member 50 having the bottom outer wall 11 and the top face 51 integrated may be placed. When the crucible 10 and support member 50 are situated so that the top face 51 of the support member 50 is in contact with the flat bottom outer wall 11, at least a portion of the bottom outer wall 11 is bonded to at least a portion of the top face 51 of the support member 50. The bottom outer wall 11 and the top face 51 of the support member 50 may be bonded by using a carbon adhesive or the like.

The upper limit for Lzo/OD, as the ratio of the outer diameter Lzo of the support member 50 with respect to the outer diameter OD of the crucible 10, is no greater than 0.25 and preferably no greater than 0.1. However, the outer diameter Lzo of the support member 50 is also 10 mm or greater, preferably 15 mm or greater and more preferably 20 mm or greater. The size of the outer diameter OD is not particularly restricted so long as Lzo/OD is in the above proportion, and it may be 50 to 300 mm, for example.

If the Lzo/OD ratio and the outer diameter Lzo are within the above range, it will be possible to reduce the effects of heat from the lower region of the crucible 10 on the Si—C solution 24, to reduce the temperature difference $\Delta T$, and to stably hold the crucible 10 by the support member 50 while preventing damage to the support member 50.

From the viewpoint of stably holding the crucible 10, the length of the support member 50 in the vertical direction is preferably 5 mm or greater. The upper limit for the length of the support member 50 in the vertical direction is not particularly restricted, but may be 100 mm or less, 50 mm or less or 30 mm or less, for example. While the effect on $\Delta T$ by the length in the vertical direction is less than by the diameter of the support member, a shorter length of the support member in the vertical direction will allow the ΔT of the Si—C solution 24 to be lower.

The heat-insulating material 18 may be situated on the periphery of the support member 50, or the periphery of the support member 50 may be a space. When a heat-insulating material 18 is provided, a portion of the heat-insulating material 18 may be a space. An atmosphere gas, such as argon gas or nitrogen gas, may be introduced into the space.

The crucible 10 and support member 50 may be integrally formed by cutting out from graphite. In this case, the border between the crucible 10 and the support member 50 is determined as follows.

When the area of the bottom outer wall 11 as the flat section of the crucible 10 is larger than the area of the top face 51 of the support member 50 as the flat section facing the bottom outer wall 11, the horizontal section of the bottom outer wall 11 of the crucible 10 having the larger area is considered to be the boundary.

When the area of the bottom outer wall 11 of the crucible 10 is smaller than the area of the top face 51 of the support member 50 facing the bottom outer wall 11, the top face 51 of the support member 50 having the larger area is considered to be the boundary.

When the area of the bottom outer wall 11 of the crucible 10 is the same as the area of the top face 51 of the support member 50 facing the bottom outer wall 11, the border is determined as follows. Since the support member 50 has a substantially constant value for the outer diameter Lzo across the vertical direction, the top face 51 of the support member 50 is the border, but when the crucible 10 and the support member 50 have the same outer diameter, the location of the bottom section thickness Lb of the crucible 10 being 15 mm, i.e. the location 15 mm below in the vertical direction from the bottom inner wall 15 is the border.

The depth of the Si—C solution 24 placed in the crucible 10 (the depth from the bottom inner wall 15 of the crucible 10 in the upward vertical direction) is 30 mm or greater, preferably 40 mm or greater and more preferably 50 mm or greater. If the depth of the Si—C solution 24 is within the above range, it will be possible to increase the upward flow rate of the Si—C solution toward the crystal growth plane, for stable growth of a SiC single crystal.

The Si—C solution 24 is heated and electromagnetically stirred with a high-frequency coil situated around the periphery of the crucible 10. The frequency, of the high-frequency coil is not particularly restricted, and may be 1 to 10 kHz or 1 to 5 KHz, for example.

Examples of features for the method of the present disclosure other than the one described above will now be explained. The method of the present disclosure is a method for producing a SiC single crystal by a solution process. In a solution process, a SiC seed crystal substrate may be contacted with a Si—C solution having a temperature gradient such that the temperature decreases from the interior toward the surface (liquid level) in the direction perpendicular to the liquid level, to grow a SiC single crystal. By forming a temperature gradient in which the temperature decreases from the interior of the Si—C solution toward the liquid level of the solution, the surface region of the Si—C solution becomes supersaturated and a SiC single crystal is grown from the seed crystal substrate contacting with the Si—C solution.

Figure 9:
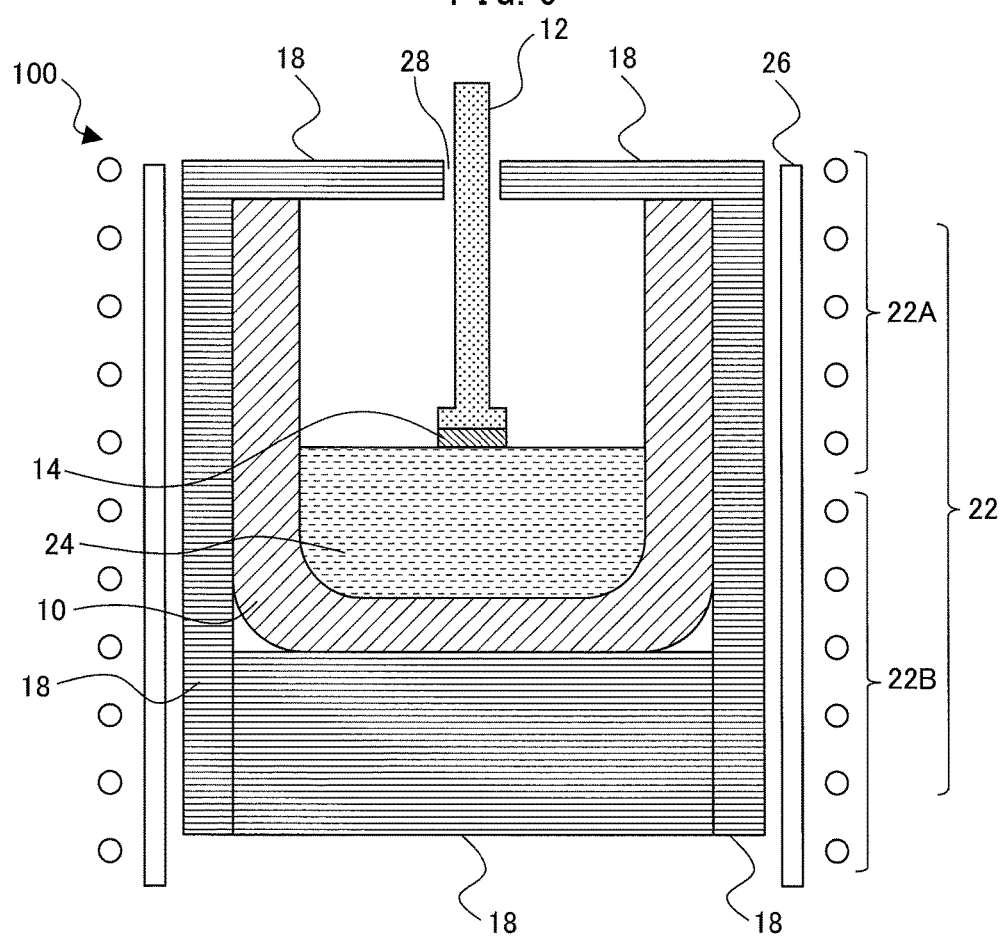
FIG. 9 is a cross-sectional schematic drawing showing a SiC single crystal production apparatus to be used in the method of the present disclosure.

FIG. 9 shows a cross-sectional schematic drawing of an example of a SiC single crystal production apparatus that can be used in the method of the present disclosure. The illustrated SiC single crystal production apparatus 100 comprises a crucible 10, wherein the crucible 10 receives a Si—C solution 24 having C dissolved in a molten liquid of Si or Si/X (X is one or more metals other than Si), a temperature gradient is formed in which the temperature is decreased from the interior of the Si—C solution 24 toward the surface of the solution, and the seed crystal substrate 14 which is held at the tip of the seed crystal holding shaft 12 that is movable in the vertical direction, is contacted with the Si—C solution 24 to allow growth of the SiC single crystal from the seed crystal substrate 14.

The Si—C solution 24 is prepared by loading the starting materials into the crucible 10, melting them by heating to prepare Si or Si/X molten liquid, and dissolving C therein. X is not particularly restricted so long as it is one or more metals other than Si and can form a liquid phase (solution) that is in a state of thermodynamic equilibrium with SiC (solid phase). Examples of suitable metals X include Ti, Cr and Ni. For example, Si may be added into the crucible 10, and then Cr and the like may be loaded in to form a Si/Cr solution or the like.

Dissolution of the C-containing crucible 10 causes C to dissolve into the molten liquid, allowing formation of a Si—C solution. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

If a carbonaceous crucible, such as a graphite crucible, or a SiC crucible, is heated by a high-frequency coil situated around the periphery of the side section, an inductive current flows by high frequency on the outer peripheral section of the crucible, thereby heating that section and heating the Si—C solution within it, and a portion of the electromagnetic field created by the high-frequency coil reaches the Si—C solution, such that Lorentz force induced by high-frequency heating is applied to the Si—C solution in the graphite crucible, producing an effect of electromagnetic stirring of the Si—C solution.

Since the temperature of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The crucible 10 comprises a heat-insulating material 18 at the upper section, the heat-insulating material 18 being provided with an opening 28 through which the seed crystal holding shaft 12 passes. By adjusting the gap (spacing) between the heat-insulating material 18 and the seed crystal holding shaft 12 at the opening 28, it is possible to vary the amount of radiation heat loss from the surface of the Si—C solution 24. It is usually necessary to keep the interior of the crucible 10 at high temperature, but setting a large gap between the heat-insulating material 18 and the seed crystal holding shaft 12 at the opening 28 can increase radiation heat loss from the surface of the Si—C solution 24 while setting a small gap between the heat-insulating material 18 and the seed crystal holding shaft 12 at the opening 28 can reduce radiation heat loss from the surface of the Si—C solution 24. The gap (spacing) between the heat-insulating material 18 and the seed crystal holding shaft 12 at the opening 28 is preferably 1 to 5 mm and more preferably 3 to 4 mm. When a meniscus has formed, as described below, radiation heat loss can take place from the meniscus portion as well.

The temperature of the Si—C solution 24 will usually have a temperature distribution with a lower temperature at the surface than the interior of the Si—C solution 24 due to radiation and the like. Further, by adjusting the number of turns and spacing of the high-frequency coil 22, the positional relationship of the high-frequency coil 22 and the crucible 10 in the height direction, and the output of the high-frequency coil 22, it is possible to form a temperature gradient in the Si—C solution 24 in the direction perpendicular to the surface of the Si—C solution 24 so that upper portion of the solution contacting the seed crystal substrate 14 is at low temperature and the lower portion (the interior) of the solution is at high temperature. For example, the output of the upper level coil 22A may be smaller than the output of the lower level coil 22B, to form a temperature gradient in the Si—C solution 24 in which the upper portion of the solution is at low temperature and the lower portion of the solution is at high temperature. The temperature gradient is preferably 10 to 50° C./cm in a range of from the solution surface to, for example, a depth of about 1 cm.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from a high-frequency coil, heat loss from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC crystal is grown on the seed crystal substrate 14 by virtue of supersaturation as a driving force.

In the method of the present disclosure, mechanical stirring of the Si—C solution may be combined with electrical magnetic stirring by high-frequency heating. For example, either or both the seed crystal substrate and the crucible may be rotated. Either or both the seed crystal substrate and the crucible may be continuously rotated in a fixed direction at a prescribed speed for at least a prescribed period of time, with periodic switching of the rotational direction. The rotational direction and rotational speed of the seed crystal substrate and crucible may be set as desired.

By periodically changing the rotational direction of the seed crystal substrate, it is possible to grow a concentric SiC single crystal, and to minimize generation of defects that may be generated in the grown crystal, and by keeping rotation in the same direction for a prescribed period of time or longer during that time, it is possible to stabilize flow of the Si—C solution directly below the crystal growth interface. If the rotation holding time is too short, switching of the rotational direction will become too frequent, and this may render flow of the Si—C solution insufficient or unstable.

When the rotational direction of the seed crystal substrate is to be periodically changed, the rotation holding time in the same direction is preferably longer than 30 seconds, more preferably 200 seconds or longer and even more preferably 360 seconds or longer. Limiting the rotation holding time in the same direction of the seed crystal substrate to within the above range will make it even easier to minimize inclusions and generation of threading dislocations.

When the rotational direction of the seed crystal substrate is periodically changed, a shorter time for the stopping time of the seed crystal substrate during switching of the rotational direction in the reverse direction is desired, and it is preferably no greater than 10 seconds, more preferably no greater than 5 seconds, even more preferably no greater than 1 second and yet more preferably substantially 0 seconds.

During growth of a SiC single crystal, it is preferred to cause crystal growth while forming a meniscus between the seed crystal substrate and the Si—C solution.

Figure 10:
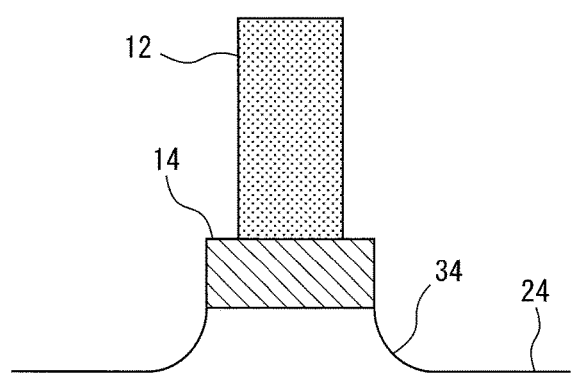
FIG. 10 is a cross-sectional schematic drawing of a meniscus formed between a seed crystal substrate and a Si—C solution.
Figure 11:
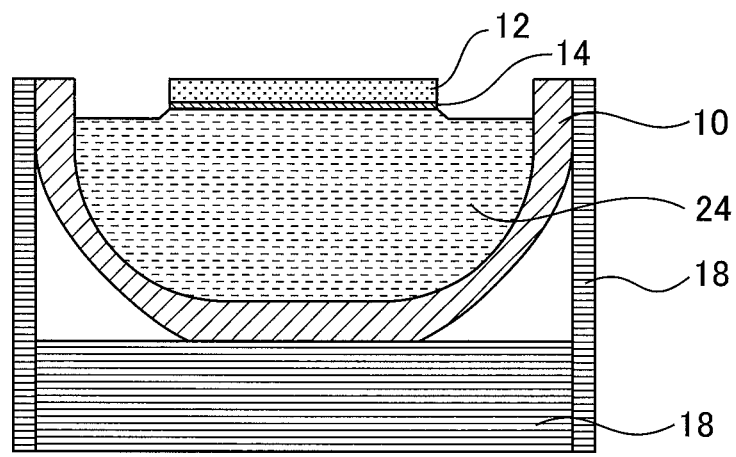
FIG. 11 is a layout of the crucible used in Example 1.
Figure 12:
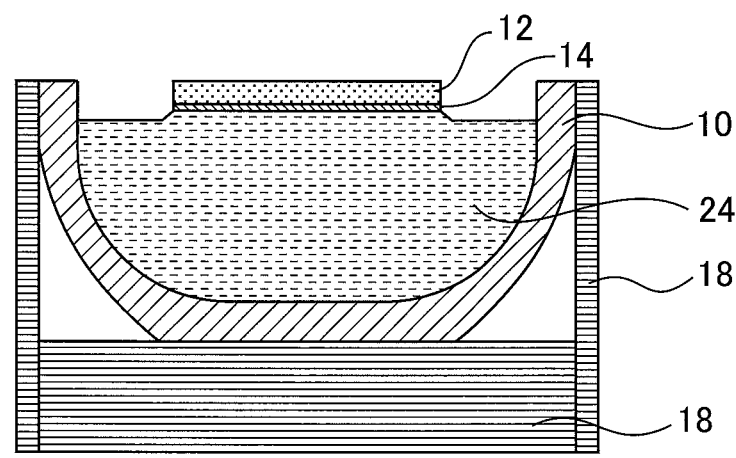
FIG. 12 is a layout of the crucible used in Example 2.
Figure 13:
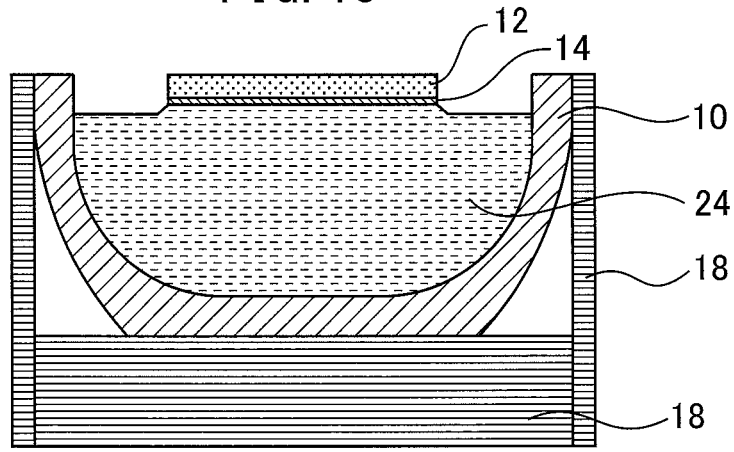
FIG. 13 is a layout of the crucible used in Example 3.
Figure 14:
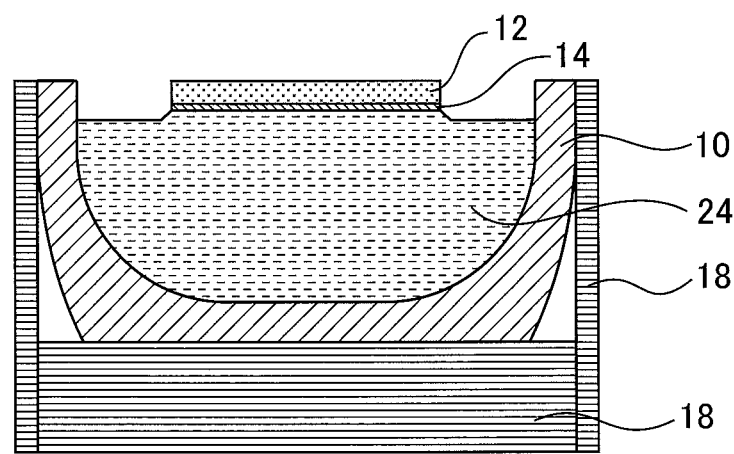
FIG. 14 is a layout of the crucible used in Example 4.

The term "meniscus" refers to a concave curved surface 34 formed on the surface of the Si—C solution 24 raised by surface tension upon wetting of the seed crystal substrate 14, as shown in FIG. 10. It is possible to grow a SiC single crystal while forming a meniscus between the seed crystal substrate 14 and the Si—C solution 24. To form a meniscus, for example, after the seed crystal substrate 14 has been contacted with the Si—C solution 24, the seed crystal substrate 14 may be raised and held at a position where the bottom face of the seed crystal substrate 14 is higher than the liquid level of the Si—C solution 24.

Since the meniscus portion formed on the outer peripheral section of the growth interface is at a lower temperature due to radiation heat loss, formation of the meniscus facilitates increase in the temperature gradient. Furthermore, since a temperature gradient can be formed in which the temperature of the Si—C solution at the outer peripheral section is lower than at the center section directly below the crystal growth plane interface, the degree of supersaturation of the Si—C solution at the outer peripheral section of the growth interface can be greater than the degree of supersaturation of the Si—C solution at the center section of the growth interface.

By thus forming a gradient for the degree of supersaturation in the horizontal direction within the Si—C solution directly below the crystal growth interface, a SiC crystal can be grown having a concave crystal growth surface. This allows crystal growth to be accomplished without the crystal growth plane of the SiC single crystal being on the on-axis plane, and can help to more easily minimize generation of inclusions and threading dislocations.

In the method of the present disclosure, a SiC single crystal having quality commonly used for production of SiC single crystals may be used as the seed crystal substrate. For example, a SiC single crystal formed in the common manner by a sublimation process may be used as the seed crystal substrate.

For example, it is possible to use, as the seed crystal substrate, a SiC single crystal having a flat growth surface which is a (0001) on-axis plane or (000-1) on-axis plane, or a SiC single crystal having a flat growth surface which has an offset angle of greater than 0° and no greater than 8°, from the (0001) on-axis plane or (000-1) on-axis plane, or a SiC single crystal having a concave growth surface which has a (0001) face or (000-1) face at a section near the center section of the concave growth surface.

The overall shape of the seed crystal substrate may be any desired shape, such as plate-like, discoid, cylindrical, columnar, truncated conic or truncated pyramidal.

Placement of the seed crystal substrate in the single crystal production apparatus may be carried out by holding the top face of the seed crystal substrate on the seed crystal holding shaft by using an adhesive or the like. The adhesive may be a carbon adhesive.

Contact of the seed crystal substrate with the Si—C solution may be carried out by lowering the seed crystal holding shaft holding the seed crystal substrate toward the Si—C liquid level, and contacting the bottom face of the seed crystal substrate with the Si—C solution while the bottom face of the seed crystal substrate is parallel to the Si—C solution surface. The seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or it may be lower than the Si—C solution surface, but in order to form a meniscus as described above, it is preferred to carry out crystal growth by holding the bottom face of the seed crystal substrate at a position above the Si—C solution surface. In order to prevent generation of polycrystals, preferably the Si—C solution is not contacted with the seed crystal holding shaft. By forming a meniscus, it is possible to easily prevent contact of the Si—C solution with the seed crystal holding shaft. In such methods, the position of the seed crystal substrate may be adjusted during crystal growth.

The seed crystal holding shaft may be a graphite shaft holding the seed crystal substrate at one end face. Preferably, the seed crystal holding shaft is made of the same material as the crucible. The seed crystal holding shaft may have any desired shape, such as cylindrical or columnar, and there may be used a graphite shaft having the same end face shape as the top face of the seed crystal substrate.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, or a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably about 5 to 50 µm for sufficient removal of an affected layer and a natural oxide film.

The meltback may be carried out by forming in the Si—C solution a temperature gradient in which the temperature increases from the interior of the Si—C solution toward the surface of the solution, i.e. by forming, in the Si—C solution, a temperature gradient in a direction opposite to the case of SiC single crystal growth. The temperature gradient in the opposite direction can be formed by adjusting the output of the high-frequency coil.

The seed crystal substrate may preheated in advance, and then the same is contacted with the Si—C solution. If the seed crystal substrate at a low temperature is contacted with the Si—C solution at high temperature, heat shock dislocations may be generated in the seed crystal. Preheating the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

EXAMPLES (Simulation of ΔT by Ld/Lu Ratio)

The ΔT value depending on the Ld/Lu ratio, during growth of a SiC single crystal by a solution process (Flux method), was simulated using CGSim (software for simulation of bulk crystal growth from solution by STR Japan, Ver. 14.1).

The ΔT value was calculated as the difference between the maximum temperature of the Si—C solution at the location of contact with the inner wall of the crucible, and the temperature at the point 6 mm from the location that exhibits the maximum temperature toward the surface of the Si—C solution directly below the center section of the crystal growth plane.

The simulation conditions were set to the following standard conditions.

(Construction of Standard Model)

As a single crystal production apparatus there was prepared a symmetrical model of the construction of a single crystal production apparatus 100 as shown in FIG. 9. The seed crystal holding shaft 12 used was a graphite shaft comprising a disc with a thickness of 2 mm and a diameter of 25 mm at the tip of a circular column with a diameter of 9 mm and a length of 180 mm. The seed crystal substrate 14 used was a discoid 4H—SiC single crystal with a thickness of 1 mm and a diameter of 25 mm.

The top face of the seed crystal substrate 14 was held at the center section of the end face of the seed crystal holding shaft 12. The heat-insulating material 18 was situated surrounding the periphery and upper section of the crucible 10 which was round as viewed from the top face. The thickness of the heat-insulating material 18 was 15 mm both at the side section and top section of the crucible 10. The seed crystal holding shaft 12 and seed crystal substrate 14 were situated such that the seed crystal holding shaft 12 passed through an opening 28 with a diameter of 20 mm, formed in the heat-insulating material 18 situated at the top section of the crucible 10. The gaps between the heat-insulating material 18 and the seed crystal holding shaft 12 at the opening 28 were each 5.5 mm.

Molten Si was placed in the graphite crucible 10. The atmosphere inside the single crystal production apparatus was helium. On the periphery of the crucible 10 in the horizontal direction, there were situated high-frequency coils 22 consisting of an upper level coil 22A and a lower level coil 22B, each capable of independent output control. The upper level coil 22A comprised a 5-coil high-frequency coil, and the lower level coil 22B comprised a 10-coil high-frequency coil. Each coil wind was lined in a row in the vertical direction at a location 65 mm from the side section of the crucible 10 in the horizontal direction, being evenly arranged in a region from a location 54.5 mm to a location 223.5 mm from the lowermost section of the outer peripheral surface of the crucible 10 in the vertical upward direction (33.5 mm from the uppermost section of the outer peripheral surface of the crucible 10 in the vertical downward direction).

The seed crystal substrate 14 held on the seed crystal holding shaft was positioned so that the bottom face of the seed crystal substrate 14 was located 1.5 mm above the location of the liquid level of the Si—C solution 24, and a meniscus was formed as shown in FIG. 10, so that the Si—C solution wetted the entire bottom face of the seed crystal substrate 14. The diameter of the meniscus portion of the liquid level of the Si—C solution 24 was 30 mm, and the shape of the meniscus between the liquid level of the Si—C solution 24 and the bottom face of the seed crystal substrate 14 was considered to be rectilinear for simplification of the calculation. With the temperature at the center of the liquid level of the Si—C solution 24 as 2000° C. and the surface of the Si—C solution as the low-temperature side, the temperature difference between the temperature at the surface of the Si—C solution and the temperature at a depth of 1 cm in the vertical direction from the surface of the Si—C solution 24 toward the interior of the solution was 25° C. The crucible 10 was rotated at 5 rpm, with the central axis of the seed crystal holding shaft 12 as the center.

The other simulation conditions were as follows.

Calculation was conducted using 2D symmetrical model;

The physical properties of the materials were as follows:

crucible 10 and seed crystal holding shaft 12 were made of graphite, density was 1.8 g/cm$^3$, thermal conductivity at 2000° C.=17 W/(m·K), emission ratio=0.9;

heat-insulating material 18 was made of graphite, density was 0.13 g/cm$^3$, thermal conductivity at 2500° C.=1.2 W/(m·K), emission ratio=0.8;

Si—C solution was molten Si, thermal conductivity at 2000° C.=66.5 W/(m·K), emission ratio=0.9; density=2600 kg/m$^3$, electric conductivity=2,245,000 S/m;

thermal conductivity of He at 2000° C.=0.579 W/(m·K); and temperature of water-cooling chamber and high-frequency coil=300K.

Examples 1 to 4

(Simulation of ΔT by Ld/Lu Ratio)

In addition to the conditions described above, the outer wall shape of the bottom side section of the crucible 10 was changed to alter the thickness Ld, and the relationship between Ld/Lu and ΔT was simulated. The layouts of the crucible 10, seed crystal holding shaft 12, seed crystal substrate 14, heat-insulating material 18 and Si—C solution 24 used for the simulation are shown in FIGS. 11 to 14.

For the crucible 10, the outer diameter was 100 mm, the inner diameter was 85 mm, the curvature radius of the inner wall of the bottom side section was R35 mm, the thickness of the side section in the horizontal direction (the thickness Lu in the horizontal direction at the same height as the liquid level of the Si—C solution 24) was 7.5 mm, the thickness Lb of the bottom section in the vertical direction was 15 mm and the crucible depth (the length in the vertical direction from the bottom inner wall 15 up to the tip of the top section of the side section) was 120 mm, and the thickness Ld in the horizontal direction at the same height of the bottom inner wall 15 was changed to 15 mm, 23.37 mm, 27.6 mm and 31.58 mm. The Ld/Lu ratios were 2.00, 3.12, 3.68 and 4.21. A heat-insulating material 18 having the same outer diameter as the outer diameter of the crucible 10 and a thickness of 30 mm in the vertical direction was situated under the crucible 10.

The frequency of the high-frequency coil 22 was 5 kHz. The depth of the Si—C solution 24 was 35 mm from the bottom inner wall 15 in the upward vertical direction.

Figure 15:
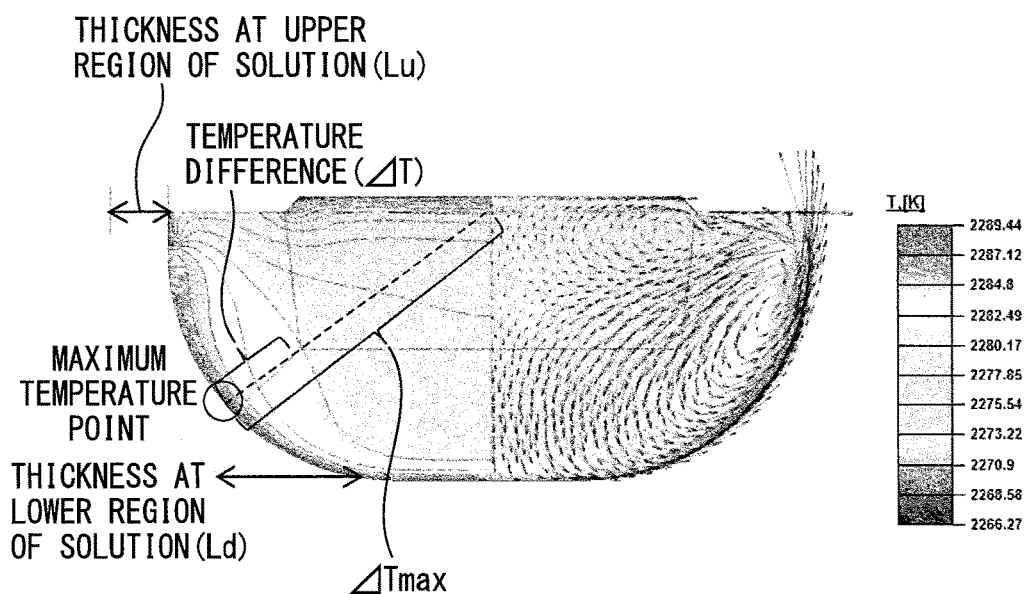
FIG. 15 shows simulation results for the temperature distribution of the Si—C solution obtained in Example 2.

ΔT was calculated by simulation under the above conditions, and it was found to be ΔT=0.0° C. in all cases. FIG. 15 shows the simulation results for temperature distribution of the Si—C solution obtained in Example 2 (layout in FIG. 12), as well as the locations of measurement of the temperature difference ΔT and ΔTmax.

Comparative Examples 1 and 2

Figure 16:
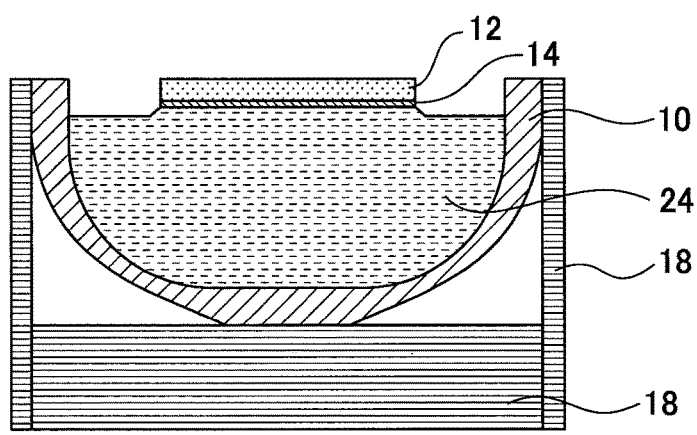
FIG. 16 shows the layout of the crucible used in Comparative Example 1.
Figure 17:
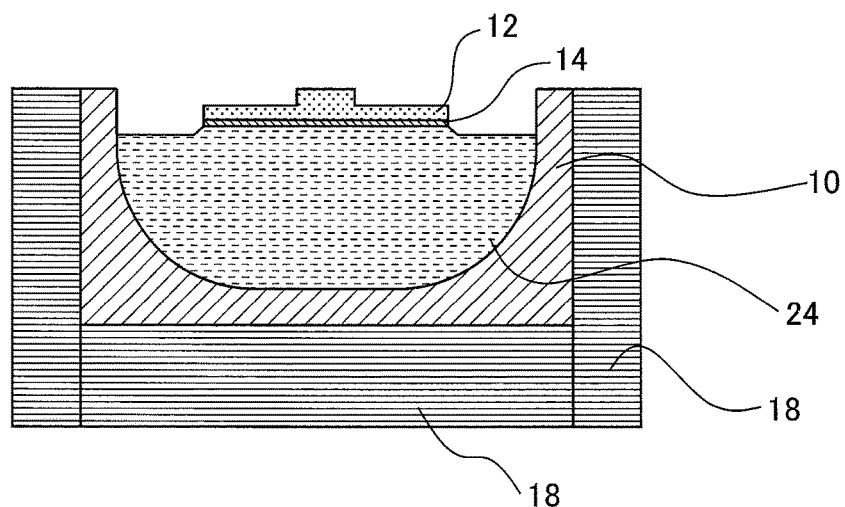
FIG. 17 shows the layout of the crucible used in Comparative Example 2.

A simulation of ΔT was conducted under the same conditions as Examples 1 to 4, except that the thicknesses were 7.5 mm and 37.5 mm and the Ld/Lu ratios were 1 and 5, respectively, as shown in the layouts of FIGS. 16 and 17. The ΔT values were 1.1° C. and 3.1° C., respectively.

Figure 18:
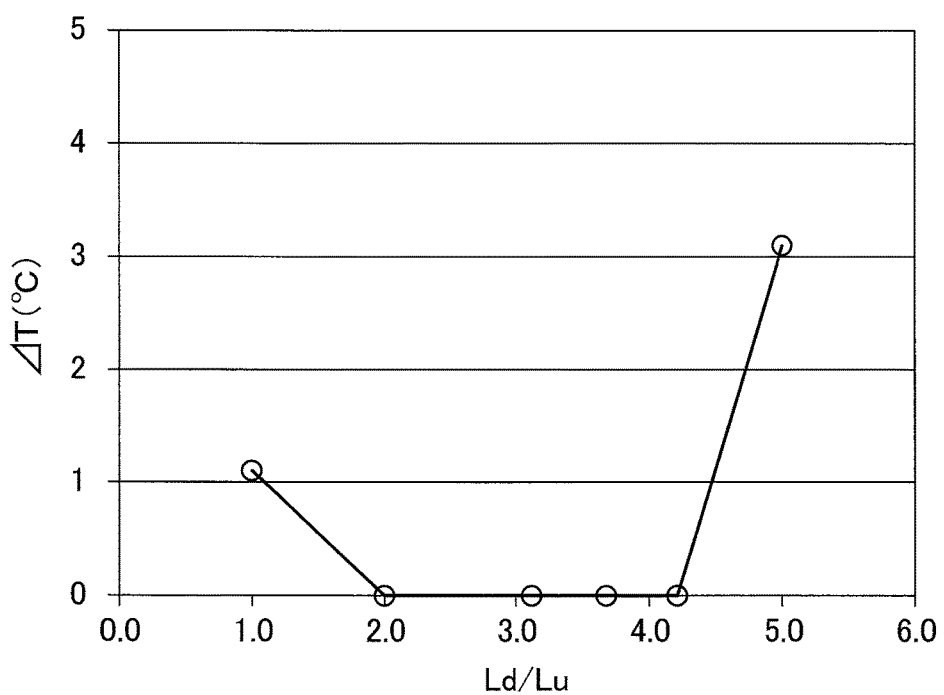
FIG. 18 is a graph showing the relationship between Ld/Lu and $\Delta T$.

FIG. 18 is a graph showing the relationship between Ld/Lu and ΔT, obtained by simulation. Table 1 shows the crucible shapes for Examples 1 to 4 and Comparative Examples 1 and 2, and the obtained ΔT and ΔTmax values.

TABLE 1

|  | Ld | Lu | Ld/Lu | ΔT | ΔTmax |
|---|---|---|---|---|---|
| Example 1 | 15 | 7.5 | 2.00 | 0.0 | 5.9 |
| Example 2 | 23.37 | 7.5 | 3.12 | 0.0 | 6.1 |
| Example 3 | 27.6 | 7.5 | 3.68 | 0.0 | 7.5 |
| Example 4 | 31.58 | 7.5 | 4.21 | 0.0 | 7.7 |
| Comp. Ex. 1 | 7.5 | 7.5 | 1.00 | 1.1 | 7.5 |
| Comp. Ex. 2 | 37.5 | 7.5 | 5.00 | 3.1 | 13.5 |

In the Ld/Lu range of 2.00 to 4.21, ΔT=0.0° C. was obtained.

Figure 19:
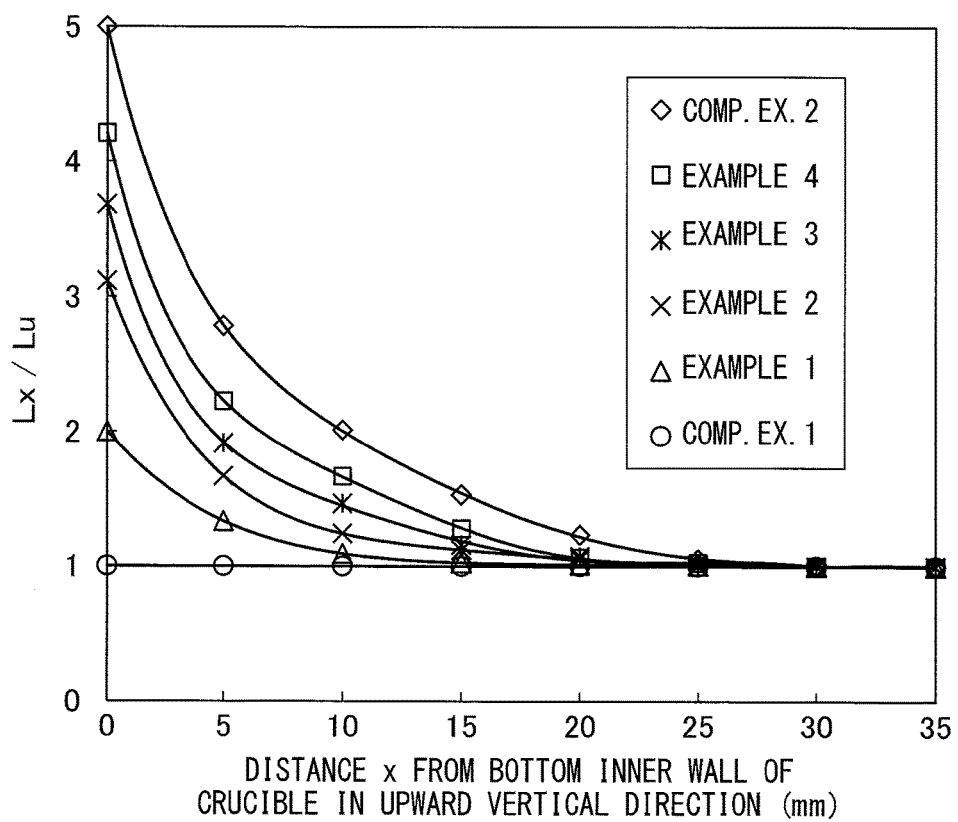
FIG. 19 is a graph of Lx/Lu with respect to height x, based on the formulas shown in Table 2.

The thicknesses of the bottom side sections of the crucibles 10 in the horizontal direction, which were the thicknesses at heights x (mm) from the bottom inner walls 15 of the crucibles 10 in the upward vertical direction, are shown as thicknesses Lx (mm), and the thicknesses Lx with respect to the heights x of the crucibles 10 in the layouts of Examples 1 to 4 and Comparative Examples 1 to 2 are shown as formulas in Table 2, and represented in graph form in FIG. 19.

TABLE 2

Ratio of thickness of bottom side section in horizontal direction with respect to height x from bottom inner wall of crucible (Lx/Lu)

Example 1  Lx/Lu = $1.19 \times 10^{-9} x^6 - 2.308 \times 10^{-7} x^5 + 1.832 \times 10^{-5} x^4 - 7.550 \times 10^{-4} x^3 + 1.706 \times 10^{-2} x^2 - 2.019 \times 10^{-1} x + 2.00$ Example 2  Lx/Lu = $5.81 \times 10^{-9} x^6 - 1.075 \times 10^{-6} x^5 + 7.528 \times 10^{-5} x^4 - 2.610 \times 10^{-3} x^3 + 4.836 \times 10^{-2} x^2 - 4.751 \times 10^{-1} x + 3.12$ Example 3  Lx/Lu = $5.535 \times 10^{-8} x^6 - 6.510 \times 10^{-6} x^5 + 3.015 \times 10^{-4} x^4 - 7.042 \times 10^{-3} x^3 + 8.984 \times 10^{-2} x^2 - 6.592 \times 10^{-1} x + 3.68$ TABLE 2-continued Ratio of thickness of bottom side section in horizontal direction with respect to height x from bottom inner wall of crucible (Lx/Lu)

| | |
|---|---|
| Example 4 | Lx/Lu = 6.981 × 10$^{-8}$x$^6$ − 8.192 × 10$^{-6}$x$^5$ + 3.756 × 10$^{-4}$x$^4$ − 8.572 × 10$^{-3}$x$^3$ + 1.052 × 10$^{-1}$x$^2$ − 7.503 × 10$^{-1}$x + 4.21 |
| Comp. Ex. 1 | Lx/Lu = 1 |
| Comp. Ex. 2 | Lx/Lu = 3.639 × 10$^{-8}$x$^6$ − 4.623 × 10$^{-6}$x$^5$ + 2.335 × 10$^{-4}$x$^4$ − 6.004 × 10$^{-3}$x$^3$ + 8.577 × 10$^{-2}$x$^2$ − 7.478 × 10$^{-1}$x + 5.00 |

Examples 4 to 6 and Comparative Examples 3 and 4

(ΔT Simulation by Lb)

The relationship between thickness Lb and ΔT was simulated under the same conditions as Example 4, except that the thickness Lb of the bottom section of the crucible in the vertical direction was changed to the range of 5 to 50 mm.

Figure 20:
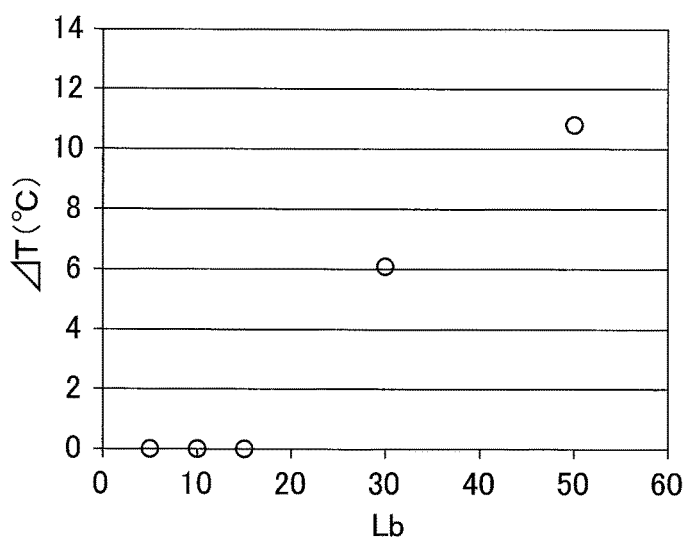
FIG. 20 is a graph showing the relationship between Lb and $\Delta T$.

Table 3 shows the thicknesses Lb and the ΔT values calculated by simulation, for Examples 4 to 6 and Comparative Examples 3 and 4. FIG. 20 is a graph showing the relationship between thickness Lb and ΔT. A result of ΔT=0.0° C. was obtained for thickness Lb in the range of up to 15 mm.

TABLE 3

| | Lb | ΔT |
|---|---|---|
| Example 6 | 5 | 0.0 |
| Example 5 | 10 | 0.0 |
| Example 4 | 15 | 0.0 |
| Comp. Ex. 4 | 30 | 6.1 |
| Comp. Ex. 3 | 50 | 10.8 |

(ΔT Simulation by Lzo/OD Ratio)

Examples 4 and 7 to 8

Figure 21:
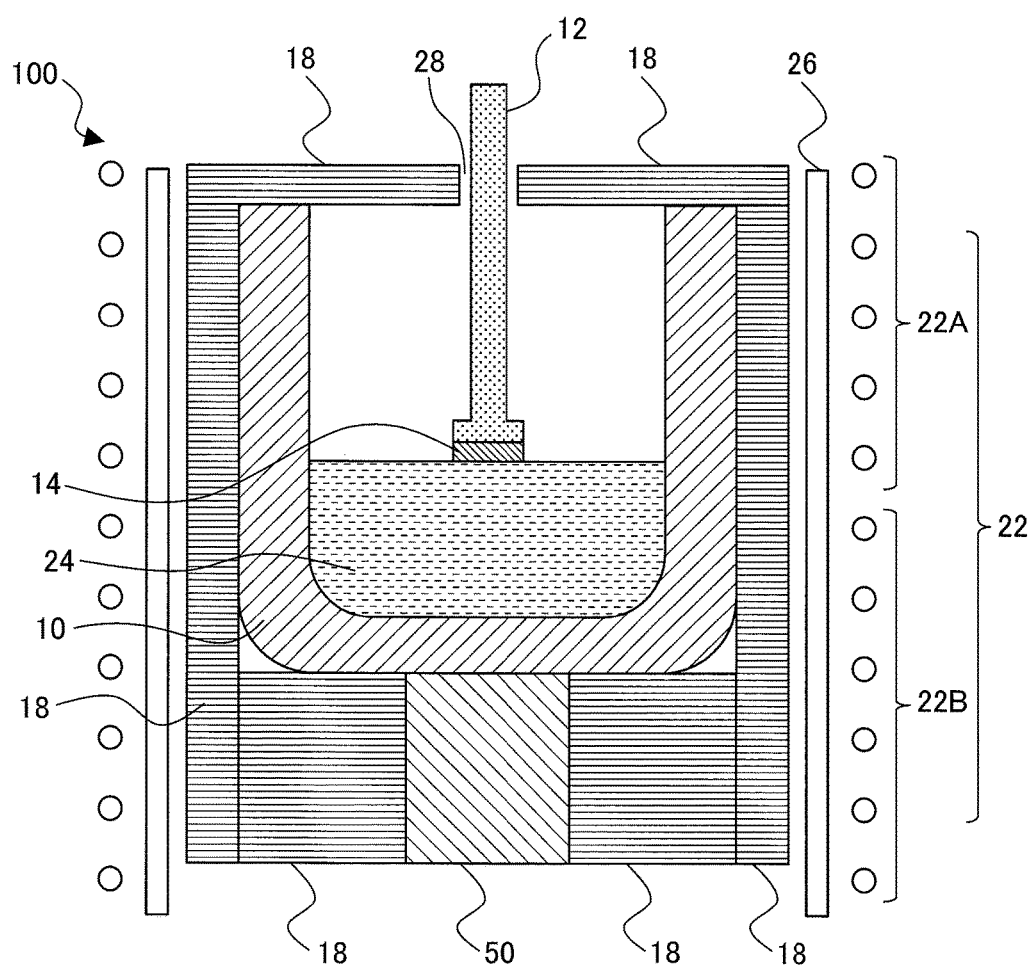
FIG. 21 is a cross-sectional schematic drawing showing a SiC single crystal production apparatus to be used in the method of the present disclosure.

As a single crystal production apparatus there was prepared a symmetrical model of the construction of a single crystal production apparatus 200 as shown in FIG. 21. The construction of the single crystal production apparatus 100 shown in FIG. 9 was the same, except for providing a holding member 50.

Figure 22:
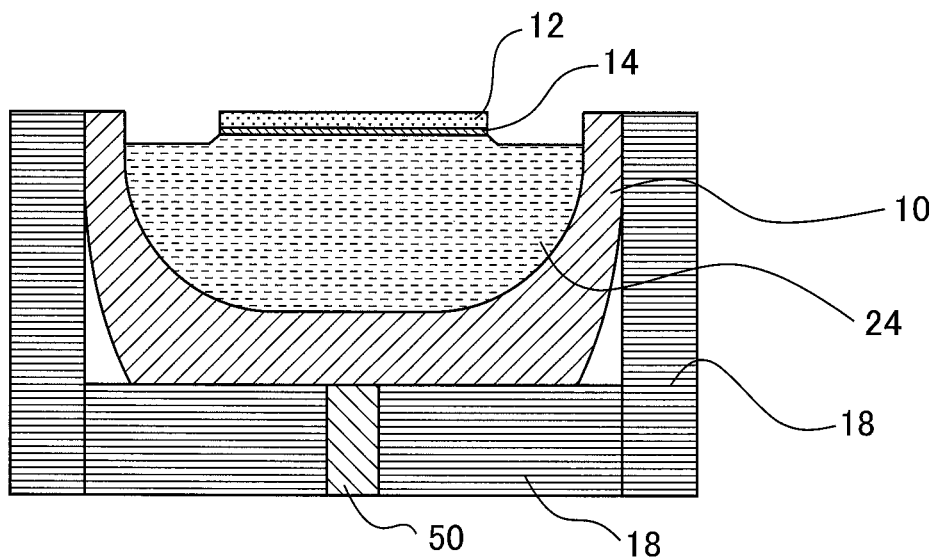
FIG. 22 is a layout of the crucible used in Example 7.
Figure 23:
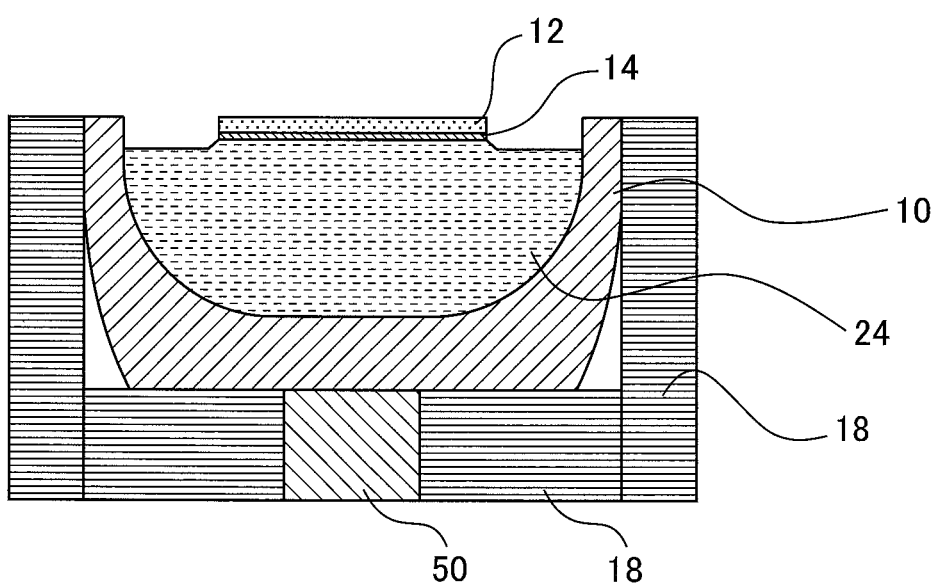
FIG. 23 is a layout of the crucible used in Example 8.

As shown in FIGS. 22 and 23, ΔT simulation was conducted under the same conditions as Example 4, except the holding member 50 was situated under the crucible 10. A heat-insulating material 18 was situated on the periphery of the holding member 50. The material of the holding member 50 was the same graphite as the crucible 10 (density was 1.8 g/cm$^3$, thermal conductivity at 2000° C.=17 W/(m·K), emission ratio=0.9). The holding member 50 was regular cylindrical with a length of 30 mm, the outer diameters were 10 mm and 25 mm, and the Lzo/OD ratios were 0.1 and 0.25, respectively. ΔT was calculated by simulation, and ΔT was found to be 0.0° C. in all cases.

Comparative Examples 5 to 7

Figure 24:
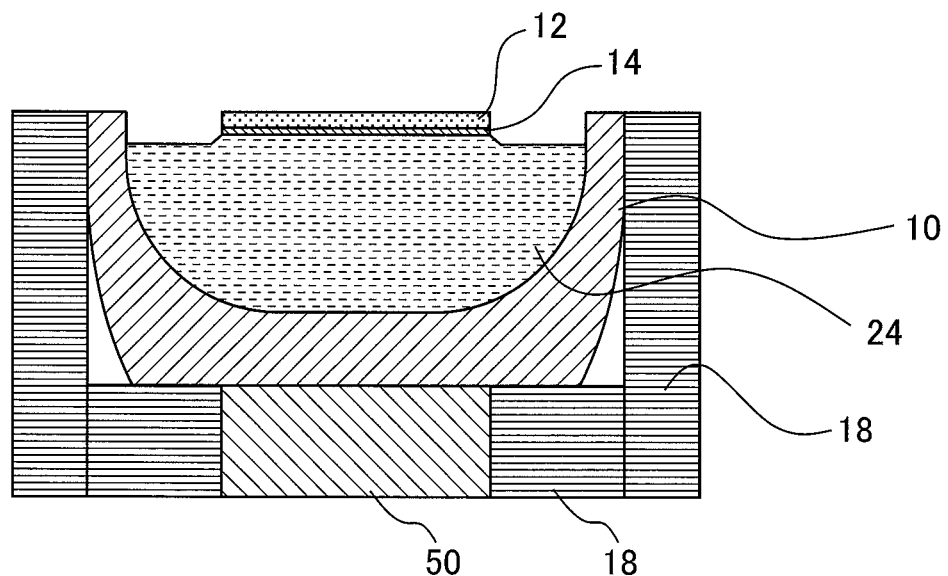
FIG. 24 shows a layout of the crucible used in Comparative Example 5.
Figure 25:
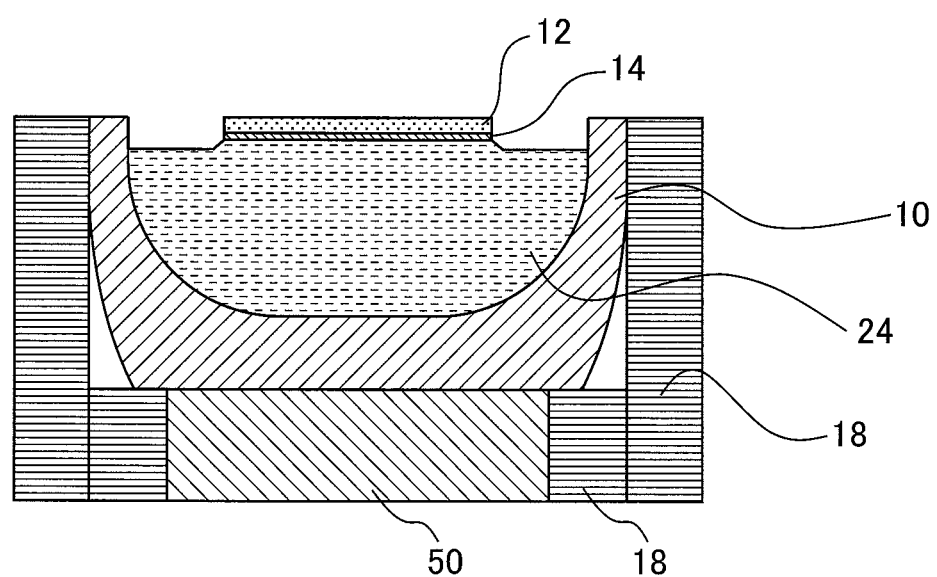
FIG. 25 shows a layout of the crucible used in Comparative Example 6.
Figure 26:
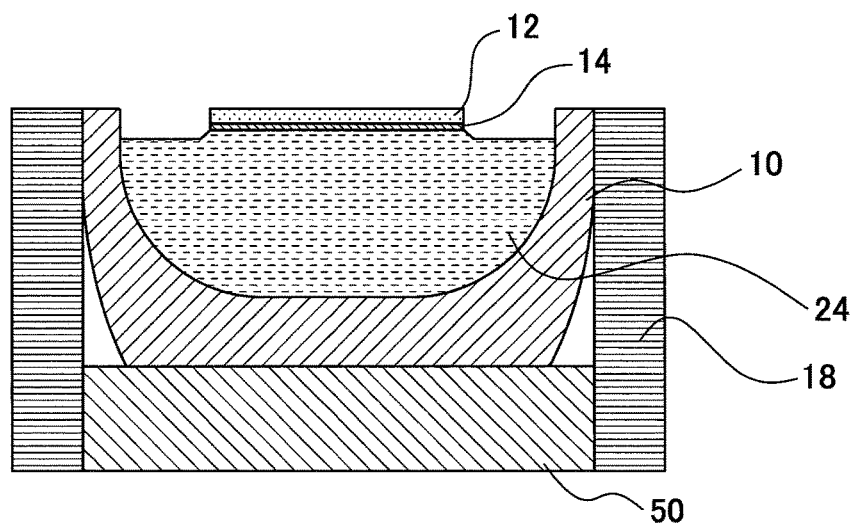
FIG. 26 shows a layout of the crucible used in Comparative Example 7.

ΔT simulation was conducted under the same conditions as Example 7, except that the outer diameters Lzo of the holding members 50 were changed to 50 mm, 75 mm and 100 mm, respectively, and the Lzo/OD ratios were 0.5, 0.75 and 1, respectively, as shown in the layouts of FIGS. 24 to 26. The heat-insulating material 18 set under the crucible 10 is reduced in size by the increase in the outer diameter of the holding member 50, and in the layout of FIG. 26, the heat-insulating material 18 set under the crucible 10 is eliminated. The ΔT values were 2.2° C., 5.1° C. and 8.0° C., respectively.

Figure 27:
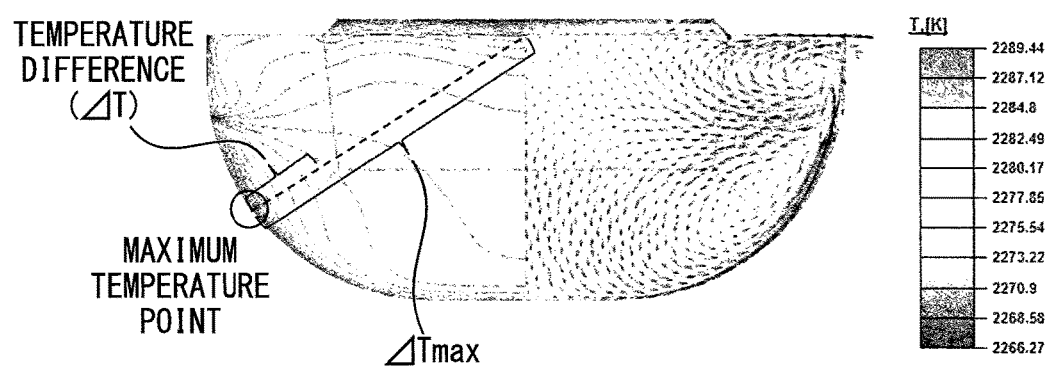
FIG. 27 shows simulation results for the temperature distribution of the Si—C solution obtained in Example 8.

FIG. 27 shows the simulation results for temperature distribution of the Si—C solution obtained in Example 8, as well as the locations of measurement of the temperature difference ΔT and ΔTmax.

Figure 28:
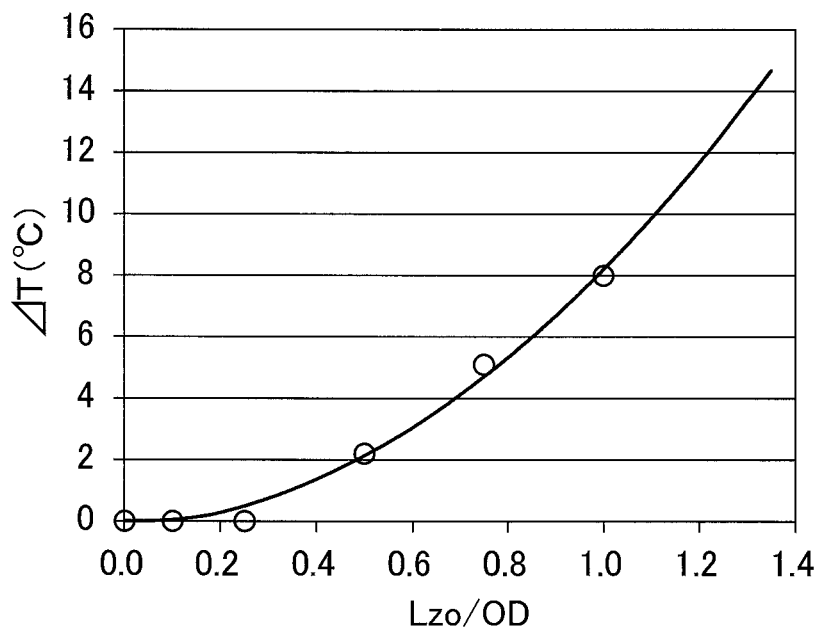
FIG. 28 is a graph showing the relationship between Lzo/OD and $\Delta T$.

Table 4 shows the thicknesses Ld, thicknesses Lu, and Ld/Lu and Lzo/OD ratios of the crucibles 10 for Examples 4 and 7 to 8 and Comparative Examples 5 to 7, as well as the ΔT and ΔTmax values calculated by simulation. FIG. 28 is a graph showing the relationship between Lzo/OD and ΔT.

TABLE 4

| | Ld | Lu | Ld/Lu | Lzo | Lzo/OD | ΔT | ΔTmax |
|---|---|---|---|---|---|---|---|
| Comp. Ex. 7 | 31.58 | 7.5 | 4.21 | 100 | 1 | 8.0 | 10.6 |
| Comp. Ex. 6 | 31.58 | 7.5 | 4.21 | 75 | 0.75 | 5.1 | 15.5 |
| Comp. Ex. 5 | 31.58 | 7.5 | 4.21 | 50 | 0.5 | 2.2 | 12.1 |
| Example 8 | 31.58 | 7.5 | 4.21 | 25 | 0.25 | 0.0 | 13.5 |
| Example 7 | 31.58 | 7.5 | 4.21 | 10 | 0.1 | 0.0 | 13.6 |
| Example 4 | 31.58 | 7.5 | 4.21 | 0 | 0 | 0.0 | 14.3 |

Example 9

(Simulation of ΔT, Changing Crucible Outer Diameter OD, Holding Member Outer Diameter Lzo, Ratio Lzo/OD, and Frequency of High-Frequency Coil)

Figure 29:
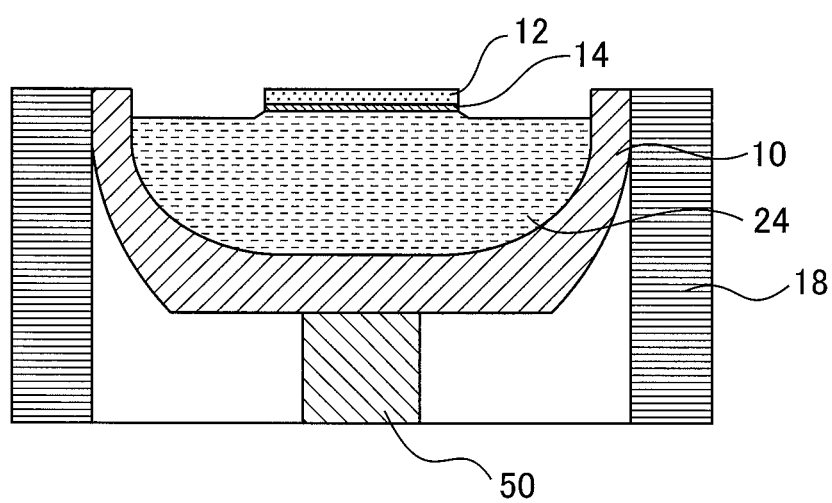
FIG. 29 is a layout of the crucible used in Example 9.
Figure 30:
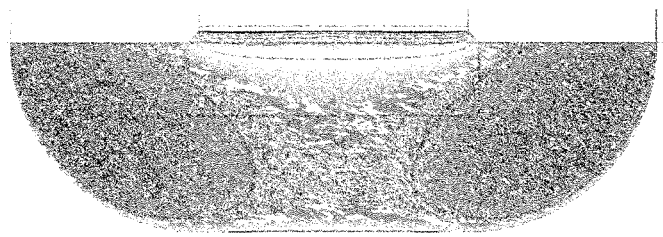
FIG. 30 shows simulation results for the temperature distribution of the Si—C solution obtained in Example 9.

A simulation of ΔT was conducted under the same conditions as Example 7 (curvature radius of inner wall of bottom side section=R35 mm, thickness Lu=7.5 mm, thickness Ld=31.58, Ld/Lu=4.21), except that the outer diameter OD of crucible 10 was 135 mm, the outer diameter Lzo of holding member 50 was 30 mm, the ratio Lzo/OD was 0.22, and the frequency of the high-frequency coil was 1.9 kHz. The layout of the crucible used in the simulation is shown in FIG. 29, and the simulation results are shown in FIG. 30. In this example as well, ΔT=0.0 was obtained as in Example 7.

Example 10

(Simulation of ΔT with Heat-Insulating Material Around Periphery of Holding Member Changed to Space)

Figure 31:
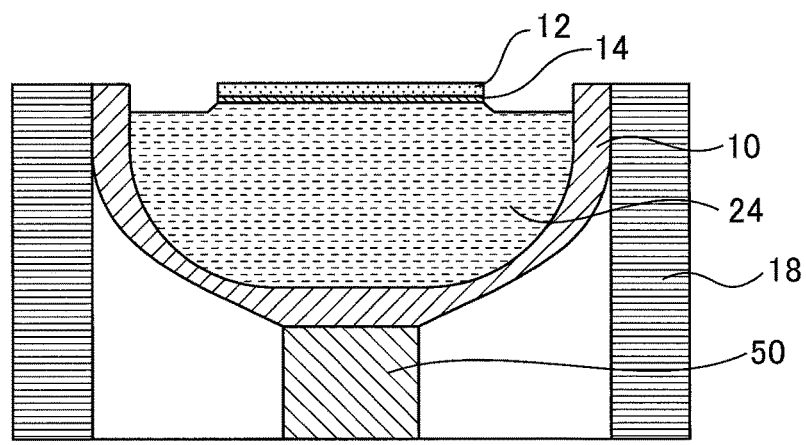
FIG. 31 is a layout of the crucible used in Example 10.
Figure 32:
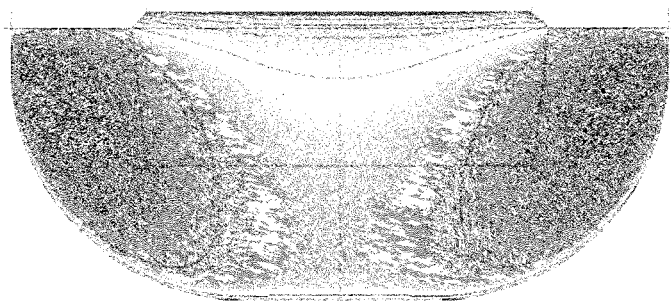
FIG. 32 shows simulation results for the temperature distribution of the Si—C solution obtained in Example 10.

A simulation of ΔT was conducted under the same conditions as Example 8, except that the heat-insulating material around the periphery of the holding member 50 was changed to a space, and the space was filled with argon gas as an atmosphere gas, at 1 atmosphere. FIG. 31 shows the layout used in the simulation. FIG. 32 shows the results of the simulation. Even when the heat-insulating material around the periphery of the holding member 50 was changed to a space, ΔT=0.0 was obtained as in Example 8.

Example 11

(SiC Crystal Growth)

An actual SiC crystal was grown under the same conditions as Example 4, except that there was prepared a SiC single crystal which was a discoid 4H—SiC single crystal with a diameter of 5.1 cm, a thickness of 1 mm, and the (000-1) face as the bottom face, fabricated by a sublimation process, for use as the seed crystal substrate, Si/Cr was loaded into a graphite crucible 10 for housing a Si—C solution, as a molten liquid starting material at an atomic composition percentage of 60:40, and the single crystal production apparatus 100 shown in FIG. 9 was used. The details regarding the growth conditions are described below.

After vacuum suction of the interior of the single crystal production apparatus 100 to 1×10⁻³ Pa, argon gas was introduced to 1 atmosphere, exchanging the air inside the single crystal production apparatus 100 with argon. A high-frequency coil 22 as a heating device situated around the periphery of the graphite crucible 10 was electrified to melt the starting material in the graphite crucible 10 by heating, thereby forming a Si/Cr alloy molten liquid. A sufficient amount of C was dissolved into the Si/Cr alloy molten liquid from the graphite crucible 10 to form a Si—C solution 24.

The outputs of the upper level coil 22A and lower level coil 22B were adjusted to heat the graphite crucible 10 so that the temperature on the surface of the Si—C solution 24 was increased to 2000° C., and the average temperature gradient, in which the temperature decreased from the solution interior toward the solution surface in a range of 1 cm from the Si—C solution 24 surface, was 25° C./cm. Temperature measurement of the surface of the Si—C solution 24 was performed with a radiation thermometer, and measurement of the temperature gradient of the Si—C solution 24 was performed using a vertically movable thermocouple.

Seed touching was carried out, in which the position of the bottom face of the seed crystal substrate 14 was placed at a position matching the liquid level of the Si—C solution 24, and the bottom face of the seed crystal substrate 14 was contacted with the Si—C solution 24, without the Si—C solution seeping upward and contacting the graphite shaft, while keeping the bottom face of the seed crystal substrate 14 bonded to the seed crystal holding shaft 12 in parallel to the liquid level of the Si—C solution 24. The seed crystal holding shaft was then raised 1.5 mm upward to form a meniscus as shown in FIG. 10, so that the Si—C solution wetted the entire bottom face of the seed crystal substrate 14. It was held for 12 hours at this position, to grow a crystal.

Upon completion of the crystal growth, the seed crystal holding shaft 12 was raised and cooled to room temperature, and the seed crystal substrate 14 and the SiC crystal grown from the seed crystal substrate were severed from the Si—C solution 24 and the seed crystal holding shaft 12 and were recovered.

Figure 33:
FIG. 33 shows an external photograph of a grown crystal observed from the side.
Figure 34:
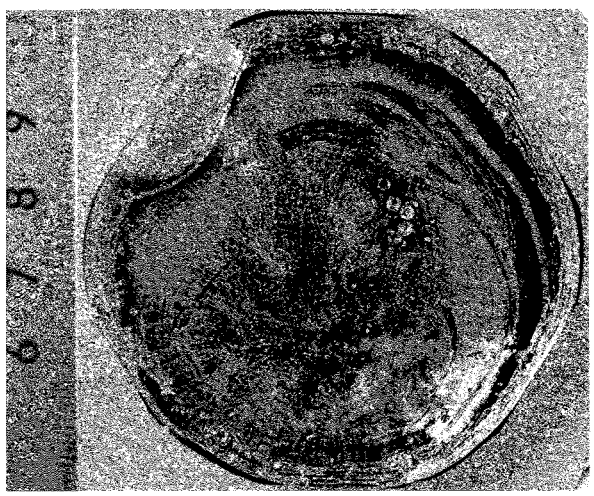
FIG. 34 shows an external photograph of a grown crystal observed from the growth surface.

The obtained grown crystal was observed by a photomicrograph of the side and growth surface, and no miscellaneous crystals were seen to be formed in the grown crystal. FIGS. 33 and 34 are external photographs of the grown crystal as observed from the side and growth surface. The obtained grown crystal had a diameter of 5.7 cm and a thickness of 2.6 mm. The diameter of the obtained grown crystal is the diameter of the growth surface.

Comparative Example 8

A SiC crystal was actually grown in the same manner as Example 11, except that the growth holding time was 10 hours, and actual growth of the SiC crystal was under the same conditions as Comparative Example 6.

Figure 35:
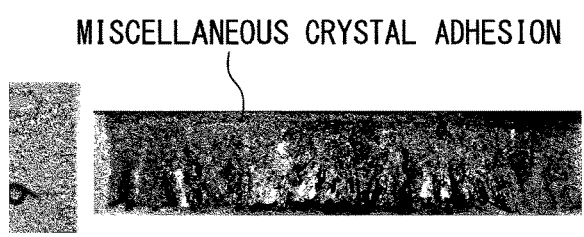
FIG. 35 shows an external photograph of a grown crystal observed from the side.
Figure 36:
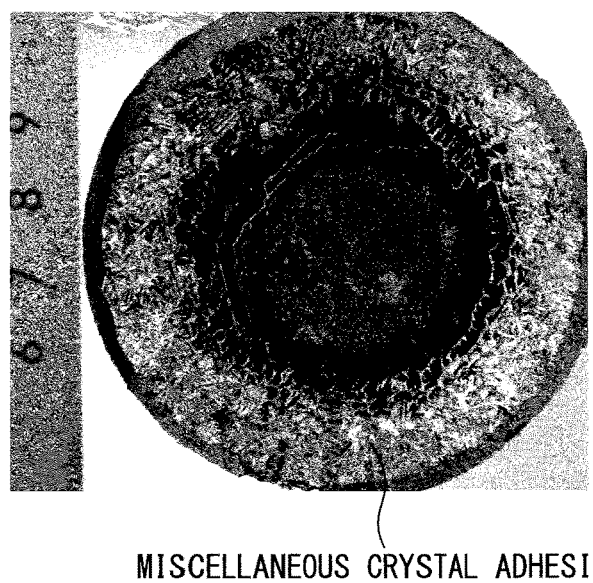
FIG. 36 shows an external photograph of a grown crystal observed from the growth surface.

The obtained grown crystal was observed by a photomicrograph of the side and growth surface, and miscellaneous crystals were seen in the grown crystal. FIGS. 35 and 36 are external photographs of the grown crystal as observed from the side and growth surface. The obtained grown crystal had a diameter of 5.8 cm and a thickness of 2.1 mm.

EXPLANATION OF SYMBOLS

1 Side section
2 Bottom side section
3 Bottom section
100 Single crystal production apparatus
200 Single crystal production apparatus
10 Crucible
50 Support member
11 Outer wall of bottom section of crucible
12 Seed crystal holding shaft
51 Top face of support member
14 Seed crystal substrate
15 Inner wall of bottom section of crucible
16 Depth of crucible
18 Heat-insulating material
22 High-frequency coil
22A Upper level high-frequency coil
22B Lower level high-frequency coil
24 Si—C solution
26 Quartz tube
28 Opening at top of crucible
34 Meniscus
40 Bottom side section region of crucible
41 Bottom side section region of crucible
ID Crucible inner diameter
OD Crucible outer diameter
Lb Thickness of bottom section in vertical direction of crucible
Lzo Outer diameter of support member
Lu Thickness of crucible in horizontal direction at liquid level height of Si—C solution
Ld Thickness of crucible in horizontal direction at bottom inner wall height
Lx Thickness of crucible in horizontal direction between Ld and Lu

What is claimed is:

1. A method for producing a SiC single crystal in which a seed crystal substrate is contacted with a Si—C solution that is placed in a crucible and has a temperature gradient such that the temperature decreases from the interior toward the liquid level, for growth of a SiC single crystal, wherein:
    the crucible has a thickness Lu in the horizontal direction of the crucible at the same height as the liquid level of the Si—C solution, and a thickness Ld in the horizontal direction of the crucible at the same height as the bottom inner wall of the crucible, the ratio Ld/Lu of Ld to Lu being 2.00 to 4.21, and the thickness in the horizontal direction of the crucible increasing in a monotonous manner between the thickness Lu and the thickness Ld, from the thickness Lu toward the thickness Ld,
    the wall thickness of the crucible is 1 mm or greater,
    the thickness Lb in the vertical direction of the bottom section of the crucible is between 1 mm and 15 mm,
    the bottom outer wall of the crucible has a flat section, the area of the flat section being 100 mm² or greater,
    the depth of the Si—C solution placed in the crucible from the bottom inner wall of the crucible is 30 mm or greater, and
    the method comprises heating and electromagnetic stirring of the Si—C solution with a high-frequency coil situated on the periphery of the crucible.

2. The method for producing a SiC single crystal according to claim 1, wherein:
    the crucible has a support member situated under the bottom section of the crucible,
    the support member is made of the same material as the crucible, at least a portion of the end of the support member is bonded to at least a portion of the bottom section of the crucible, the ratio Lzo/OD, of the outer diameter Lzo of the support member with respect to the outer diameter OD of the crucible, is no greater than 0.25, and the outer diameter Lzo of the support member is 10 mm or greater and the length is 5 mm or greater.

* * * * *